(12) United States Patent
Wong et al.

(10) Patent No.: US 11,728,344 B2
(45) Date of Patent: Aug. 15, 2023

(54) HYBRID SRAM DESIGN WITH NANO-STRUCTURES

(71) Applicant: Taiwan Semiconductor Manufacturing Co., Ltd., Hsin-Chu (TW)

(72) Inventors: I-Hsieh Wong, Hsinchu (TW); Wei-Yang Lee, Taipei (TW); Feng-Cheng Yang, Zhudong Township (TW); Yen-Ming Chen, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/847,116

(22) Filed: Apr. 13, 2020

(65) Prior Publication Data

US 2020/0411530 A1 Dec. 31, 2020

Related U.S. Application Data

(60) Provisional application No. 62/868,377, filed on Jun. 28, 2019.

(51) Int. Cl.
*H01L 27/092* (2006.01)
*H01L 29/423* (2006.01)
(Continued)

(52) U.S. Cl.
CPC .... *H01L 27/0924* (2013.01); *H01L 21/02532* (2013.01); *H01L 21/3065* (2013.01);
(Continued)

(58) Field of Classification Search
CPC ..... H01L 21/823821; H01L 21/823431; H01L 21/8238–823892; H01L 27/0924;
(Continued)

(56) References Cited

U.S. PATENT DOCUMENTS 7,425,740 B2   9/2008   Liu et al.
8,048,723 B2   11/2011  Chang et al.
(Continued)

FOREIGN PATENT DOCUMENTS

EP    3340308 A1      6/2018
KR    20170063353 A   6/2017
KR    20170107364     9/2017

OTHER PUBLICATIONS

NOA dated Nov. 30, 2021, Issued by the Korean Intellectual Property Office in Korean Patent Application No. 10-2020-0078356, 6 pages.

*Primary Examiner* — Errol V Fernandes
*Assistant Examiner* — Jeremy J Joy
(74) *Attorney, Agent, or Firm* — Haynes and Boone, LLP

(57) ABSTRACT

A semiconductor device includes a first device disposed in an NMOS region of the semiconductor device. The first device includes a first gate-all-around (GAA) device having a vertical stack of nano-structure channels. The semiconductor device also includes a second device in a PMOS region of the semiconductor device. The second device includes a FinFET that includes a fin structure having a fin width. The fin structure is separated from an adjacent fin structure by a fin pitch. A maximum channel width of the nano-structure channels is no greater than a sum of: the fin width and the fin pitch. Alternatively, the second device includes a second GAA device having a different number of nano-structure channels than the first GAA device.

20 Claims, 21 Drawing Sheets

(51) Int. Cl.
  *H01L 29/06* (2006.01)
  *H01L 29/78* (2006.01)
  *H01L 29/10* (2006.01)
  *H01L 29/786* (2006.01)
  *H10B 10/00* (2023.01)
  *H01L 21/02* (2006.01)
  *H01L 21/3065* (2006.01)
  *H01L 29/66* (2006.01)
  *H01L 21/8238* (2006.01)

(52) U.S. Cl.
  CPC ...... *H01L 29/0673* (2013.01); *H01L 29/1037* (2013.01); *H01L 29/42392* (2013.01); *H01L 29/66439* (2013.01); *H01L 29/7851* (2013.01); *H01L 29/78696* (2013.01); *H10B 10/12* (2023.02); *H01L 21/823807* (2013.01); *H01L 21/823821* (2013.01); *H01L 27/0922* (2013.01); *H01L 29/66545* (2013.01); *H01L 29/66795* (2013.01)

(58) Field of Classification Search
  CPC ............. H01L 27/0886; H01L 27/1211; H01L 27/1104; H01L 27/10826; H01L 27/10879; H01L 27/092–098; H01L 29/66795; H01L 29/785–7851; H01L 29/42392; H01L 29/0673; H01L 29/78696; H01L 29/66545
  See application file for complete search history.

(56) References Cited

U.S. PATENT DOCUMENTS

| | | | |
|---|---|---|---|
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 10,002,939 B1* | 6/2018 | Cheng | H01L 29/41725 |
| 10,185,798 B2* | 1/2019 | Kim | H01L 27/0924 |
| 10,332,803 B1* | 6/2019 | Xie | H01L 29/42376 |
| 10,332,881 B1* | 6/2019 | Badaroglu | H01L 29/0649 |
| 10,347,657 B1* | 7/2019 | Leobandung | H01L 29/42392 |
| 10,892,331 B2* | 1/2021 | Yamashita | H01L 29/775 |
| 11,031,395 B2* | 6/2021 | Ohtou | H01L 29/1079 |
| 2013/0153993 A1* | 6/2013 | Chang | H01L 29/66795 |
| | | | 257/329 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2015/0243733 A1* | 8/2015 | Yang | H01L 29/0673 |
| | | | 257/401 |
| 2015/0311085 A1* | 10/2015 | Kozarsky | H01L 21/3086 |
| | | | 257/401 |
| 2015/0311286 A1 | 10/2015 | Lee et al. | |
| 2015/0370947 A1* | 12/2015 | Moroz | H10B 10/12 |
| | | | 716/119 |
| 2016/0163810 A1 | 6/2016 | Huang et al. | |
| 2017/0098648 A1* | 4/2017 | Lee | H01L 21/823468 |
| 2017/0133459 A1* | 5/2017 | Pranartharthiharan | H01L 29/66795 |
| 2017/0255735 A1* | 9/2017 | Kim | G06F 30/392 |
| 2017/0271477 A1 | 9/2017 | Palle et al. | |
| 2017/0278842 A1* | 9/2017 | Song | H01L 21/823431 |
| 2018/0033871 A1* | 2/2018 | Xie | H01L 21/02532 |
| 2018/0108750 A1* | 4/2018 | Glass | H01L 21/823807 |
| 2018/0158836 A1 | 6/2018 | Kim et al. | |
| 2018/0233570 A1* | 8/2018 | Hellings | H01L 29/7851 |
| 2019/0088553 A1 | 3/2019 | Van Dal | H01L 21/02532 |
| 2019/0115424 A1* | 4/2019 | Park | H01L 29/1004 |
| 2019/0214409 A1* | 7/2019 | Leobandung | H01L 29/78654 |
| 2020/0006356 A1* | 1/2020 | Ando | H01L 21/02532 |
| 2020/0020692 A1* | 1/2020 | Ching | H01L 29/775 |
| 2020/0035563 A1* | 1/2020 | Zhang | H01L 29/66439 |
| 2020/0043926 A1* | 2/2020 | Ohtou | H01L 29/0649 |
| 2020/0220017 A1* | 7/2020 | Rachmady | H01L 29/0847 |
| 2020/0258740 A1* | 8/2020 | Lee | H01L 29/66795 |
| 2020/0343247 A1* | 10/2020 | Cheng | H10B 10/125 |
| 2020/0365703 A1* | 11/2020 | Chung | H01L 29/66545 |
| 2020/0388681 A1* | 12/2020 | Yamashita | H01L 21/823821 |

* cited by examiner

HYBRID SRAM DESIGN WITH NANO-STRUCTURES

PRIORITY DATA

The present application is a utility application of provisional U.S. patent application 62/868,377, filed on Jun. 28, 2018, entitled "Hybrid SRAM Design with Nano-structures", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in memory devices such as Static Random Access Memory (SRAM) devices, it may be desirable to increase the number of NMOS channels, which may help improve SRAM device performance. However, increasing the number of NMOS channels may also increase the overall area of the SRAM device, which is undesirable.

Therefore, although conventional memory devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
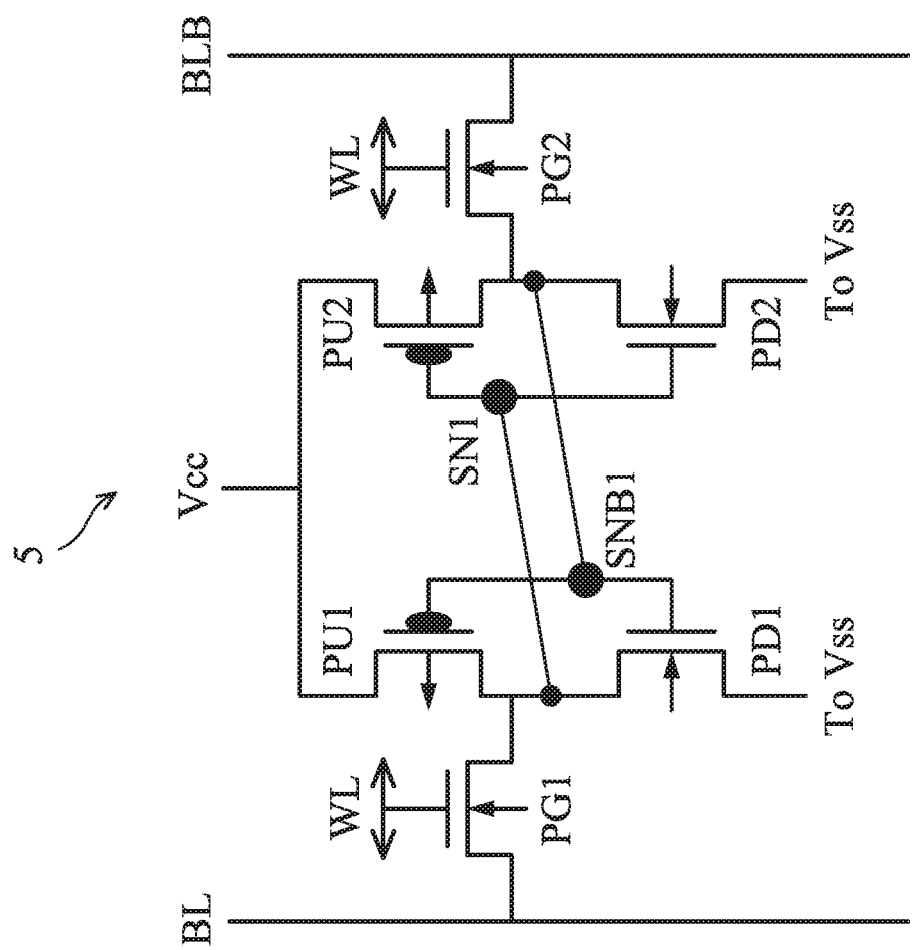
FIG. 1 is a circuit diagram of an SRAM according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a static random access memory (SRAM) device. An SRAM device is a type of semiconductor memory that uses bi-stable latching circuitry (e.g., flip-flop) to store binary bits of information. FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

According to the various aspects of the present disclosure, SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects of the following disclosure may be discussed using FinFET devices as examples, but it is understood that the application is not limited to FinFET devices, except as specifically claimed.

Figure 2:
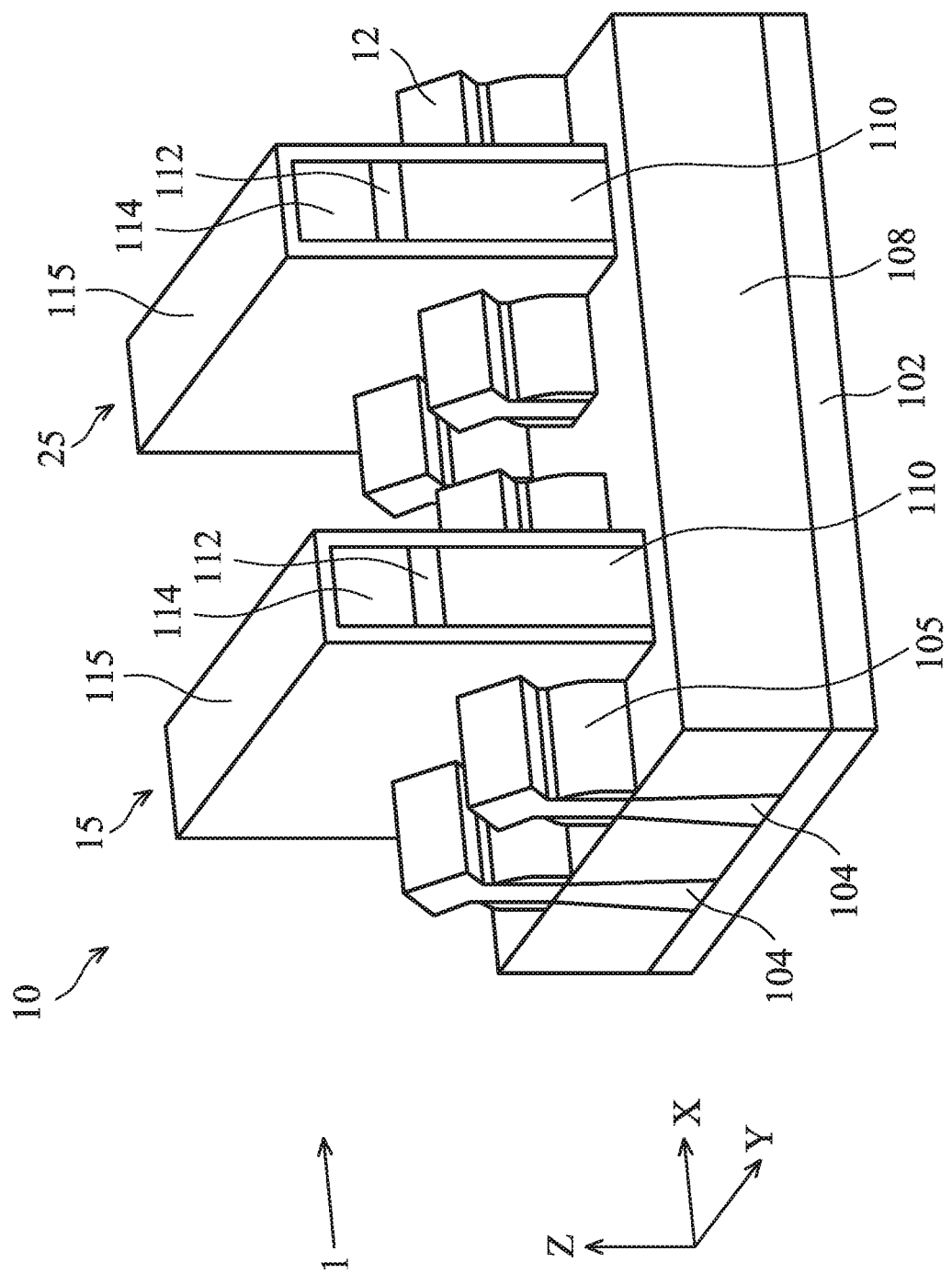
FIG. 2 is a perspective view of a FinFET device according to various aspects of the present disclosure.

Referring to FIG. 2, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 2. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

Using FinFETs to implement SRAM devices may offer certain benefits as discussed above, but it may also cause certain issues. For example, in order to optimize the performance of SRAM devices (e.g., higher current capabilities), it may be helpful to implement the SRAM such that it has more NMOS channels (e.g., in pass-gate transistors and/or pull-down transistors) than PMOS channels (e.g., in pull-up transistors). In the case of FinFETs, one way to implement a greater number of NMOS channels is to form multiple NMOS fin structures for every PMOS fin structure (e.g., two NMOS fin structures for every PMOS fin structure). However, doing so would entail enlarging chip area, since the extra NMOS fin structures would occupy additional space. Since chip size/area reduction is also one of the goals for modern semiconductor device manufacturing, conventional SRAM devices may have difficulty in attempting to improve performance and to reduce (or at least maintain) a small device footprint simultaneously.

According to the various aspects of the present disclosure, SRAM devices can be implemented with a hybrid structure in order to simultaneously achieve optimized device performance as well as reduced device size. Such a hybrid structure can be implemented with FinFETs for PMOS transistors of the SRAM and multi-channel devices (e.g., gate-all-around devices) for the NMOS transistors of the SRAM. Alternatively, the hybrid structure can also be implemented with the multi-channel devices for both PMOS and NMOS transistors of the SRAM, but with a different number of channels between the PMOS and NMOS transistors. The various aspects of the present disclosure are discussed below with reference to FIGS. 1-20.

Figure 3A:
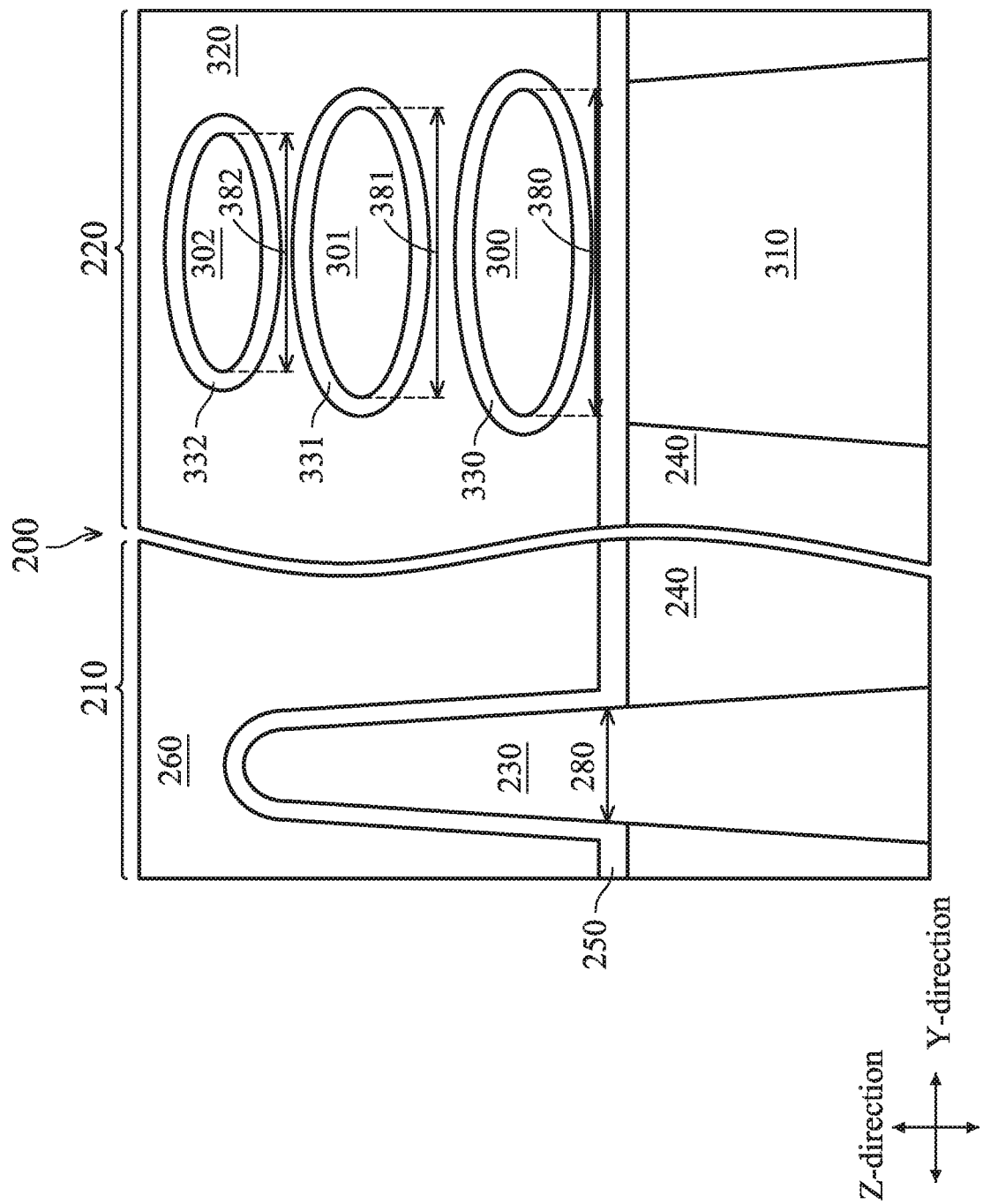
FIGS. 3A-3B and 4-18 cross-sectional side views of portions of a semiconductor device at various stages of fabrication according to various aspects of the present disclosure.
Figure 3B:
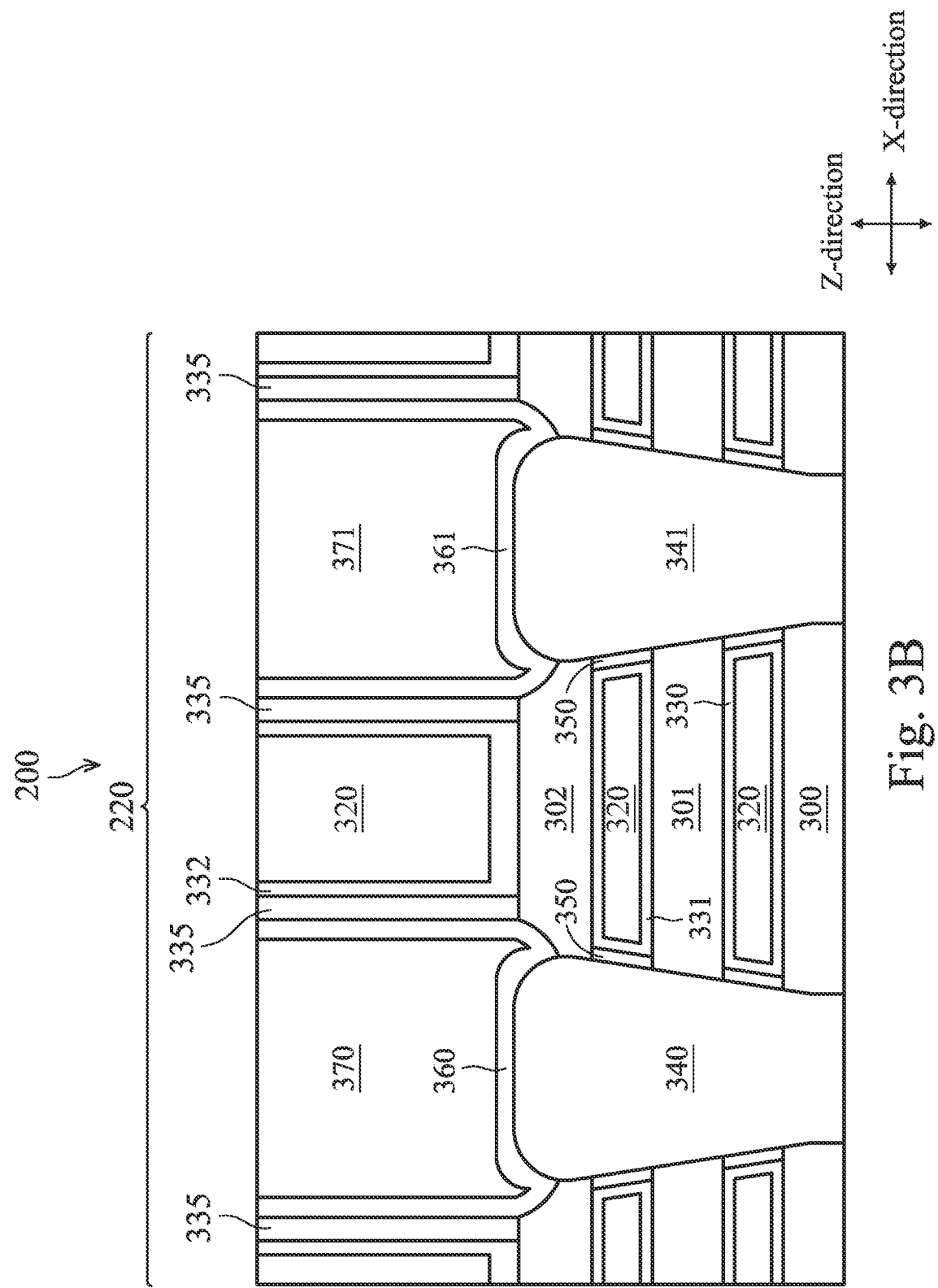

FIGS. 3A-3B are diagrammatic fragmentary cross-sectional side views of a portion of a semiconductor device 200 that contains a hybrid structure according to an embodiment of the present disclosure. In more detail, FIG. 3A is a cross-sectional side view taken along a Y-Z plane of FIG. 2, and FIG. 3B is a cross-sectional side view taken along an X-Z plane of FIG. 2. As such, FIG. 3A may also be referred to as a "Y-cut", and FIG. 3B may also be referred to as an "X-cut." In some embodiments, the semiconductor device 200 includes an SRAM device, but it is understood that this is not intended to be limiting unless recited in the claims.

Referring now to FIG. 3A, the semiconductor device 200 includes a PMOS region 210 and an NMOS region 220. In some embodiments, the PMOS region 210 includes PMOS transistors, which may be the pull-up transistors such as PU1 and PU2 of the SRAM device 5 discussed above with reference to FIG. 1. On the other hand, the NMOS region 220 includes NMOS transistors, which may be the pull-down transistors such as PD1 and PD2 or the pass-gate transistors such as PG1 and PG2 of the SRAM device 5 discussed above with reference to FIG. 1.

As shown in FIGS. 3A-3B, the semiconductor device 200 is a hybrid structure because the PMOS region 210 is implemented using FinFETs, whereas the NMOS region 220 is implemented using multi-channel devices such as gate-all-around (GAA) devices, nanosheet devices, nanowire devices, or other suitable shapes. Depending on the particular application, different types of nano-structure devices may be used. The FinFETs of the PMOS region 210 may be implemented as an embodiment of the FinFET 10 discussed above with reference to FIG. 2. For example, a fin structure 230 (as an embodiment of the fin structure 104 discussed above) may protrude vertically in the Z-direction out of an isolation structure 240 (as an embodiment of the isolation structure 108 discussed above). A gate dielectric layer 250 (e.g., a high-k gate dielectric) is formed over a portion of the upper surfaces and side surfaces of the fin structure 230. A gate electrode layer 260 is (e.g., as an embodiment of the gate electrode 110 discussed above) is formed over the gate dielectric layer 250. The gate electrode layer 260 may be a metal gate electrode, and it may include one or more work function metal layers and one or more fill metal layers. The work function metal layers may be configured to tune a work function (Vt) of the transistor, whereas the fill metal layer may serve as a main conductive portion of the gate electrode layer 260. The gate electrode 260 partially "wraps around" the fin structure 230. The fin structure 230 may have a fin width 280 that is the maximum lateral dimension of the fin structure 230 measured in the Y-direction.

In comparison to the FinFET of the PMOS region 210, the multi-channel device of the NMOS region 220 may include any device that has its gate structure, or portions thereof, formed on multiple-sides of a channel region that includes multiple channel structures (e.g., circumferentially surrounding a portion of each channel structure). The channel region of a multi-channel device may include nano-structure channels that may be shaped as sheets, bars, wires, and/or other suitable channel configurations of GAA devices. In some embodiments, the channel region of a multi-channel device may have multiple horizontal nano-sheets or horizontal bars vertically spaced apart from one another, making the multi-channel device a vertically stacked device. The multi-channel devices presented herein may include n-type metal-oxide-semiconductor devices.

As a non-limiting example, the multi-channel device of the NMOS region 220 has three nano-structure channels 300-302 that are formed over a semiconductive layer 310 (e.g., a silicon layer). In some embodiments, the nano-structure channels 300-302 may include a semiconductive material such as silicon, or a group IV material (e.g., a material containing one or more elements selected from the group IV family of the periodic table), or a group III-V material (e.g., a compound containing elements selected from the group III family and the group V family of the periodic table). As non-limiting examples, the group IV material may include Si, Ge, SiGe, GeSn, or SiGeSn, etc., and the group III-V material may include GaAs, AlGaAs, InAs, etc. In some embodiments, the nano-structure channels 300-302 each have a thickness or vertical dimension (in the Z-direction) that is in a range between about 2 nanometers (nm) and about 10 nm.

As shown in the cross-sectional view (on the Y-Z plane) in FIG. 3A, the nano-structure channels 300, 301, and 302 are circumferentially surrounded by gate dielectric layers 330, 331, and 332, respectively. In some embodiments, the gate dielectric layers 330-332 may each include a high-k dielectric material. A gate electrode 320 circumferentially surrounds the gate dielectric layers 330-332 (and therefore circumferentially surrounds the nano-structure channels 300-302 as well). The gate electrode 320 may have a similar material composition as the gate electrode 260, for example it may be a metal gate electrode. Disposed on the sidewalls of the gate dielectric layers 332 are gate spacers 335. The gate spacers 335 may include a dielectric material, for example SiOx, SiN, SiON, SiOC, SiCN, or SiOCN. Note that the gate spacers 335 are not directly visible in FIG. 3A, since it illustrates the Y-cut view at a cross-sectional location where the gate spacers 335 are absent.

As shown in FIG. 3B, the multi-channel device of the NMOS region 220 may also include source/drain components, such as source/drain components 340-341. The source/drain components 340-341 are disposed on opposite sides of the gate electrode 320 in the X-direction. The multiple nano-structure channels 300-302 are disposed between the source/drain components 340-341. In order to reduce parasitic capacitance, inner spacers 350 may also be formed between the source/drain components 340-341 and the gate dielectric layers 330-331. The inner spacers 350 may include a dielectric material, for example SiOx, SiN, SiON, SiOC, SiCN, or SiOCN. Etching-stop layers 360-361 may also be formed over the source/drain components 340-341, respectively. As shown in FIG. 3B, the gate spacers 335 may be located between the etching-stop layers 360-361 and the gate dielectric layers 332. Inter-layer dielectric (ILD) components 370-371 may be formed over the etching-stop layers 360-361, respectively. In some embodiments, the etching-stop layers 360-361 may include a dielectric material, for example SiOx, SiN, SiON, SiOC, SiCN, or SiOCN.

In some embodiments, the ILD components 370-371 may include a dielectric material, for example SiOx, SiON, SiOC, or SiOCN.

Note that the nano-structure channels 300-302 need not have the same dimensions or sizes as one another. For example, the nano-structure channels 300-302 may have lateral dimensions 380-382 (also referred to as channel widths) measured in the Y-direction, respectively. In some embodiments, the lateral dimension 380>the lateral dimension 381>the lateral dimension 382. In some other embodiments, the lateral dimension 380<the lateral dimension 381<the lateral dimension 382. In some embodiments, a ratio of the lateral dimension 380 and 381 is in a range between about 0.75:1 and 1.25:1, and a ratio of the lateral dimension 381 and 382 is in a range between about 0.75:1 and 1.25:1. In some embodiments, the smallest one of the lateral dimensions 380-382 varies within 40%-100% of the greatest one of the lateral dimensions 380-382. The lateral dimensions 380-382 may also be equal to or greater than the fin width 280. In some embodiments, a ratio between any one of the lateral dimensions 380-382 and the fin width 280 is in a range between about 1:1 and about 15:1.

Regardless of how the lateral dimensions 380-382 vary with respect to one another, it is understood that the greatest one of the lateral dimensions 380-382 is still smaller than a sum of the fin width 280 and a fin pitch. In more detail, a fin pitch may refer to a distance between the fin structure 230 and its nearest (or most immediately adjacent) fin structure in the Y-direction. The fin pitch is measured from the same side surfaces of both fin structures, for example from the "left" side surface of the fin structure 230 and the "left" side surface of the fin structure immediately adjacent to the "left" of the fin structure 230.

The present disclosure simultaneously achieves a chip area reduction and enhanced device performance due to the fact that the lateral dimensions 380-382 is smaller than a sum of the fin width 280 and the fin pitch. In more detail, the speed of a transistor may be correlated with an amount of current that the transistor can handle, and the amount of current may be correlated with an effective width of a channel. As such, in order to achieve a faster speed, it may be desirable to increase the effective width of a channel. For SRAM devices, it is desirable to achieve a faster speed (and higher current) for NMOS devices such as pull-down and pass-gate devices. In order to accomplish this, a conventional FinFET SRAM device may need to implement multiple (e.g., at least two) fin structures in the NMOS region for every fin structure in the PMOS region. The extra fin structures in the NMOS region correspond to an increase in the effective width of the channel, which helps increase the speed.

However, the multiple fin structures in the NMOS region consume more chip real estate, which is valuable, especially as the device scaling down process continues. To preserve chip real estate, the present disclosure effectively replaces what would have been multiple fin structures in the NMOS region 220 with a vertical stack of nano-structure channels 300-302. Since the multiple nano-structure channels 300-302 each have its surfaces circumferentially surrounded by the gate electrode 320, and there are multiple nano-structure channels 300-302 (e.g., three in the illustrated embodiment), the NMOS region 220 of the present disclosure can still handle a current at least as high as a plurality of fin structures. In other words, by replacing the FinFET in the NMOS region 220 with a GAA device, the present disclosure does not sacrifice performance such as current capability. Meanwhile, the fact that the nano-structures 300-302 have smaller lateral dimensions than the sum of the fin width and the fin pitch means that the hybrid structure herein can achieve a reduction in chip area compared to conventional SRAM devices where both the NMOS and PMOS devices are implemented using FinFETs. Therefore, the semiconductor device 200 of the present disclosure can simultaneously achieve good device performance and a small footprint.

Figure 4:
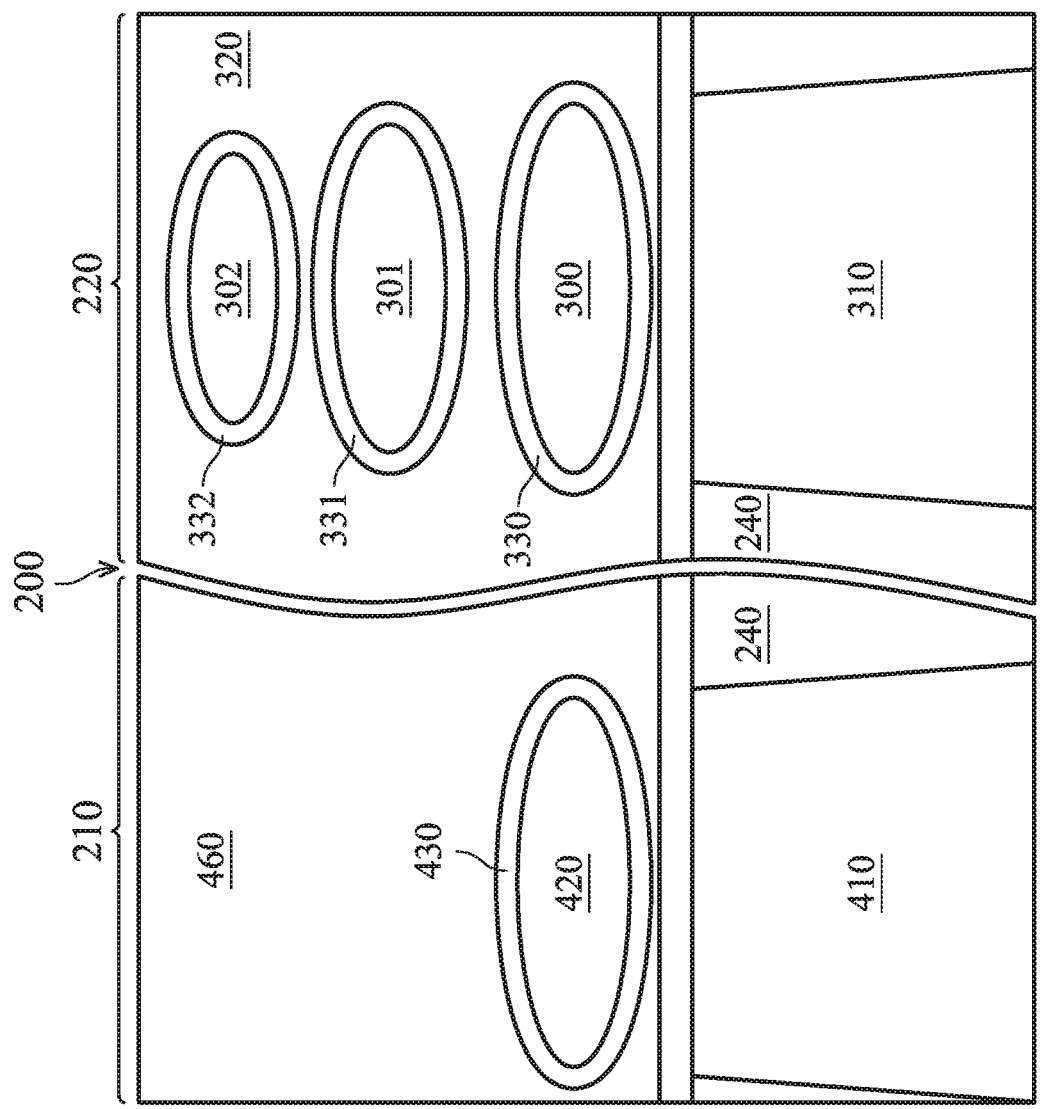
Figure 5:
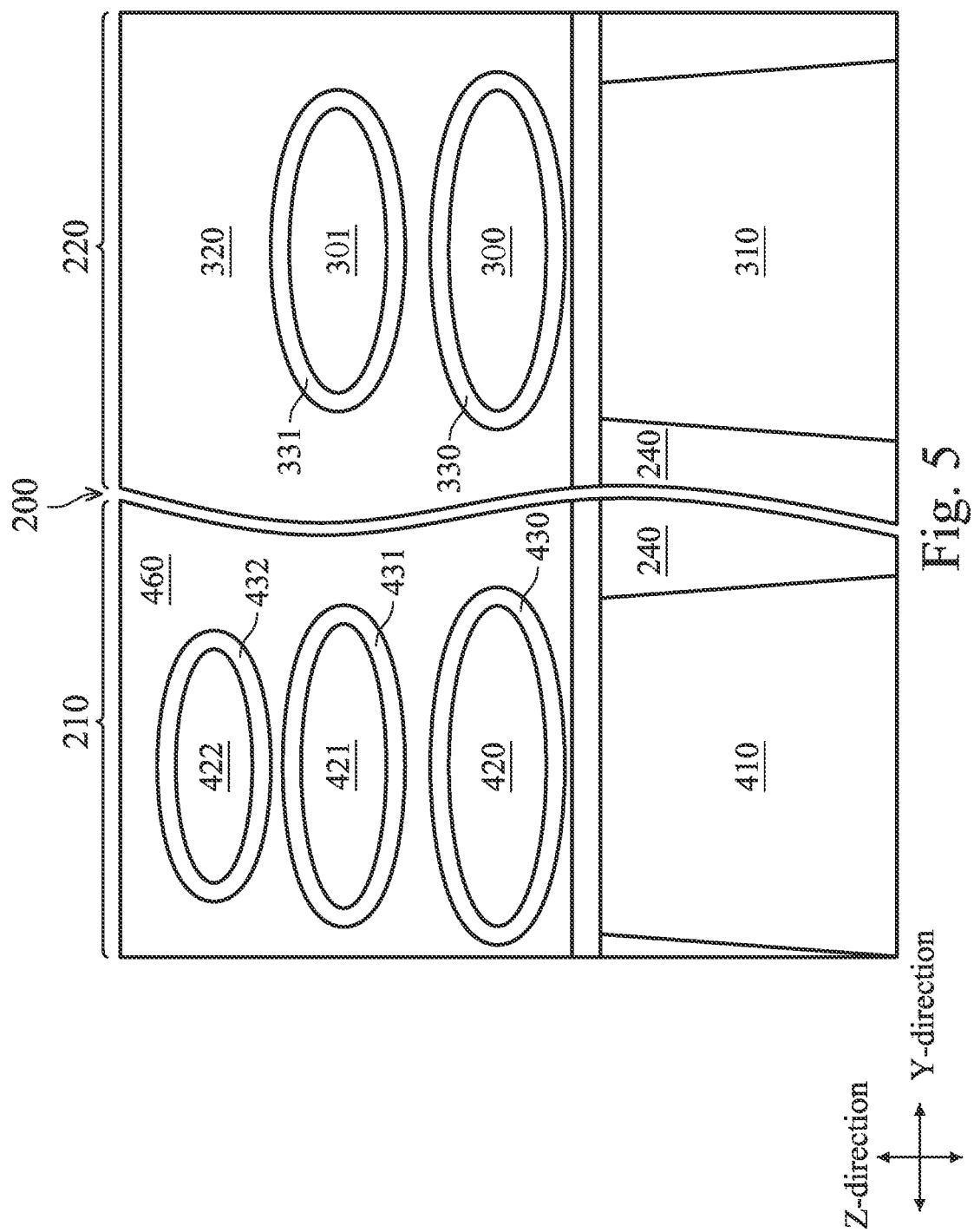

Although FIGS. 3A-3B illustrate an embodiment where the PMOS region 210 is implemented using FinFETs, and the NMOS region 220 is implemented using GAA devices, it is understood that this is not intended to be limiting. In other embodiments, both the PMOS region 210 and the NMOS region 220 may be implemented using multi-channel devices such as GAA devices, but with an uneven (or unequal) number of channels between the PMOS region 210 and the NMOS region 220. Some of these embodiments are illustrated in FIGS. 4-5, which are diagrammatic fragmentary cross-sectional side views of the semiconductor device 200 along the Y-Z plane (similar to FIG. 3A). For reasons of consistency and clarity, similar components appearing in both the embodiment illustrated in FIGS. 3A-3B and the embodiments illustrated in FIGS. 4-5 are labeled the same.

Referring to FIG. 4, the NMOS region 220 is substantially similar to the NMOS region 220 of the embodiment shown in FIG. 3A. For example, the NMOS region 220 includes the semiconductor layer 310 surrounded by the isolation structure 240, and a vertical stack of nano-structure channels 300-302 is formed over the semiconductor layer 310. The nano-structure channels 300-302 are also circumferentially surrounded by gate dielectric layers 330-332 and a gate electrode 320, and they may have similar lateral dimensions as the nano-structure channels shown in FIG. 3A.

However, unlike the embodiment shown in FIG. 3A, the PMOS region 210 is also implemented using nano-structure channel devices such as GAA devices, as opposed to FinFETs. The number of nano-structure channels in the PMOS region 210 is less than the number of the nanostructure channels in the NMOS region 220. For example, whereas the NMOS region 220 has three nano-structure channels 300-302, the PMOS region 210 has just one nano-structure channel 420, which is formed over a semiconductor layer 410 and is circumferentially surrounded by a gate dielectric layer 430 and a gate electrode 460. It is understood that the nano-structure channels 300 and 420 may have different sizes or dimensions. In some embodiments, a ratio of the sizes (measured in the Y-direction) between the nano-structure channel 300 and the nano-structure channel 420 is in a range between about 0.75:1 and about 1.25:1. In some embodiments, the gate dielectric layer 430 may be a high-k gate dielectric layer, and the gate electrode 460 may be a metal gate electrode.

Similar to the embodiment shown in FIG. 3A, the embodiment shown in FIG. 4 achieves an area reduction since the NMOS region 220 is implemented using a vertical stack of nano-structure channels 300-302, which occupies a smaller lateral space than multiple fin structures. In the PMOS region 210, the single nano-structure channel 420 can still provide a sufficient effective channel width for its transistor's operation. For applications where the NMOS current is desired to be greater than the PMOS current, the fact that there are fewer nano-structure channels in the PMOS region 210 than in the NMOS region 220 will facilitate this goal, since a fewer number of channels may lead to a smaller current.

It is understood that the ratio between the number of nano-structure channels in the PMOS region 210 and the number of nano-structure channels in the NMOS region 220 is not limited to 1:3. In various other embodiments, such a ratio may be in a range between about 1:4 and about 1.5:1. In other words, the PMOS region 210 may actually have a greater number of nano-structure channels than the NMOS region 220 in some embodiments. For example, referring to FIG. 5, the PMOS region 210 includes a vertical stack of three nano-structure channels 420, 421, and 422, which are circumferentially surrounded by gate dielectric layers 430, 431, and 432, respectively. In comparison, the NMOS region 220 includes a vertical stack of two nano-structure channels 300-301, which are circumferentially surrounded by gate dielectric layers 330-331, respectively. In other words, there are more PMOS nano-structure channels than NMOS nano-structure channels in the embodiment shown in FIG. 5. As a result, the current for the PMOS transistors may be greater than the current for the NMOS transistors, which may be beneficial for certain types of IC applications.

Figure 6:
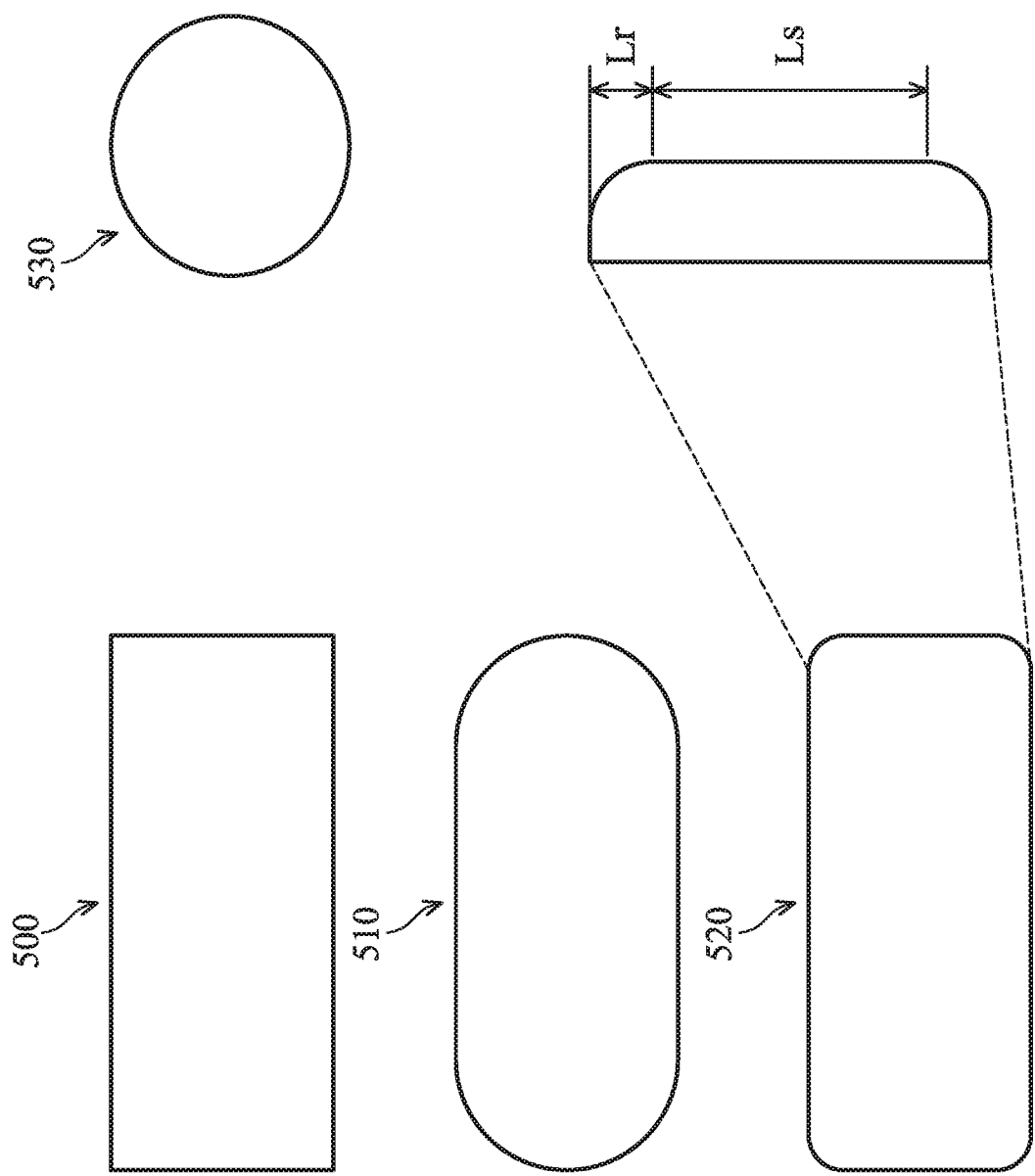

Although FIGS. 3A and 4-5 have illustrated the nano-structure channels 300-302 and 420-422 as having ellipse-like cross-sectional profiles, it is also understood that the nano-structure channels 300-302 and 420-422 may be implemented to have a variety of other suitable shapes or profiles. For example, FIG. 6 illustrates the alternative suitable cross-sectional profiles for the nano-structure channels such as the nano-structure channels 300-302 or 420-422 in the Y-Z plane. In one embodiment, the nano-structure channels 300-302 or 420-422 may have a substantially rectangular cross-sectional profile 500. In another embodiment, the nano-structure channels 300-302 or 420-422 may have a substantially rounded trapezoid cross-sectional profile 510. In yet another embodiment, the nano-structure channels 300-302 or 420-422 may have a substantially rounded rectangular cross-sectional profile 520. In one more embodiment, the nano-structure channels 300-302 or 420-422 may have a substantially circular cross-sectional profile 530. Other suitable profiles may include squares (including rounded squares) or triangles (including rounded triangles). In embodiments where the profile is rounded (e.g., rounded rectangle or square, etc), it is understood that a rounding ratio may be defined as Lr/Ls, where Lr represents the length of the rounded or curved segment, and Ls represents the straight segment. In some embodiments, the rounding ratio may be in a range between about 15:100 and about 1:1.

Figure 7:
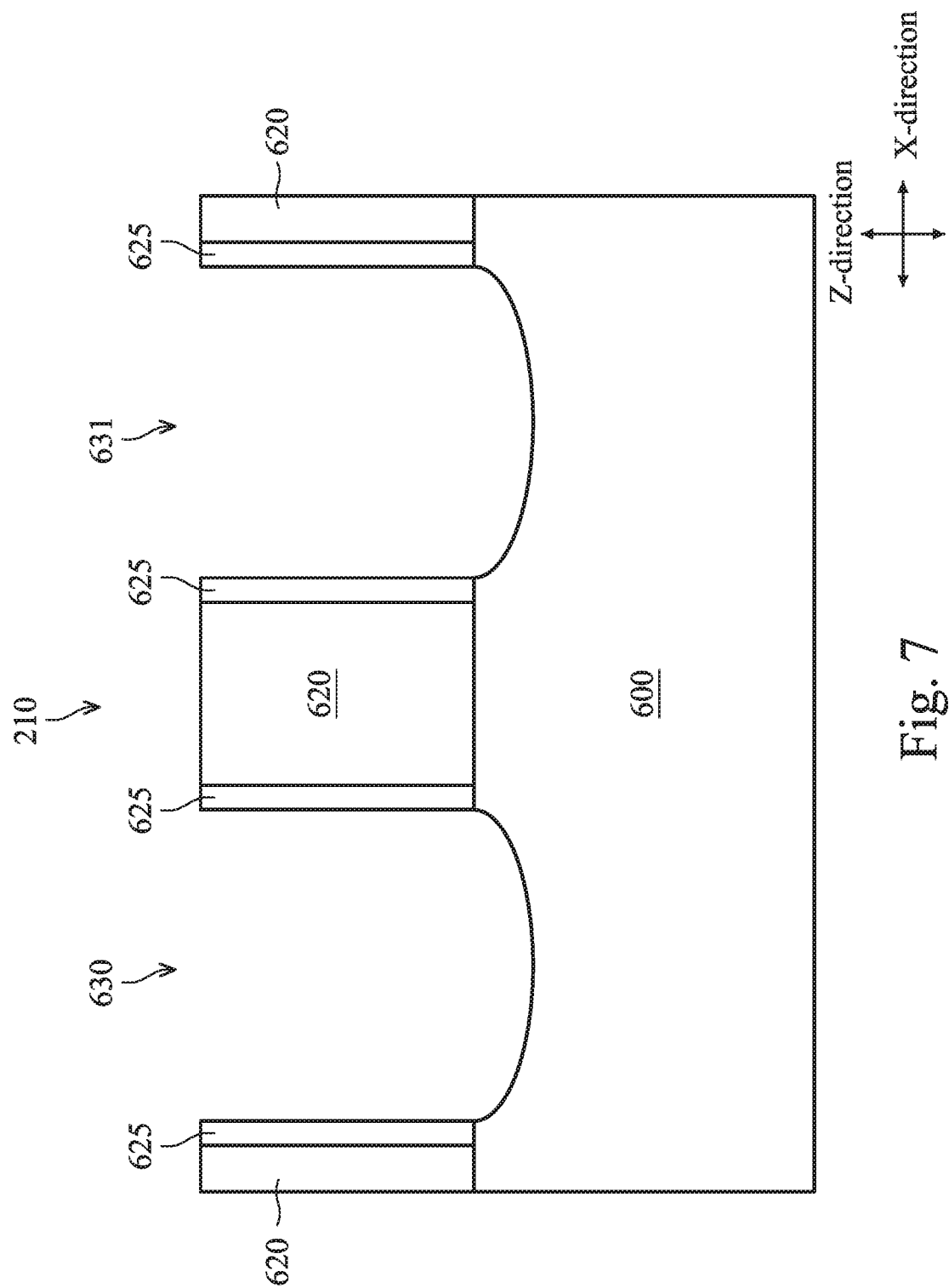

FIGS. 7-18 are diagrammatic cross-sectional side views (along the X-Z plane) of a portion of the semiconductor device 200 at various stages of fabrication, so as to illustrate the fabrication process flows of the PMOS region 210 and the NMOS region 220. Referring to FIG. 7, a semiconductive layer 600 is formed in the PMOS region 210, for example over a substrate. The semiconductive layer 600 may include Si, SiGe, a group IV material, or a group III-V material. The semiconductive layer 600 includes fin structures such as the fin structure 230 of FIG. 3A. It is understood that channel regions of PMOS transistors are formed via the fin structures.

A dummy gate layer 620 is formed over the semiconductive layer 600. In some embodiments, the dummy gate layer 620 may include a polysilicon gate electrode layer and a suitable gate dielectric layer, which may be a dummy gate dielectric layer such as silicon oxide, or a high-k gate dielectric layer. One or more lithography processes may be performed to pattern the dummy gate layer 620, so as to form openings 630-631, for example. Gate spacers 625 are formed on the sidewalls of the patterned dummy gate layer 620. The gate spacers 625 may include a dielectric material, for example SiOx, SiN, SiON, SiOC, SiCN, or SiOCN. Portions of the semiconductive layer 600 are exposed by the openings 630-631.

Figure 8:
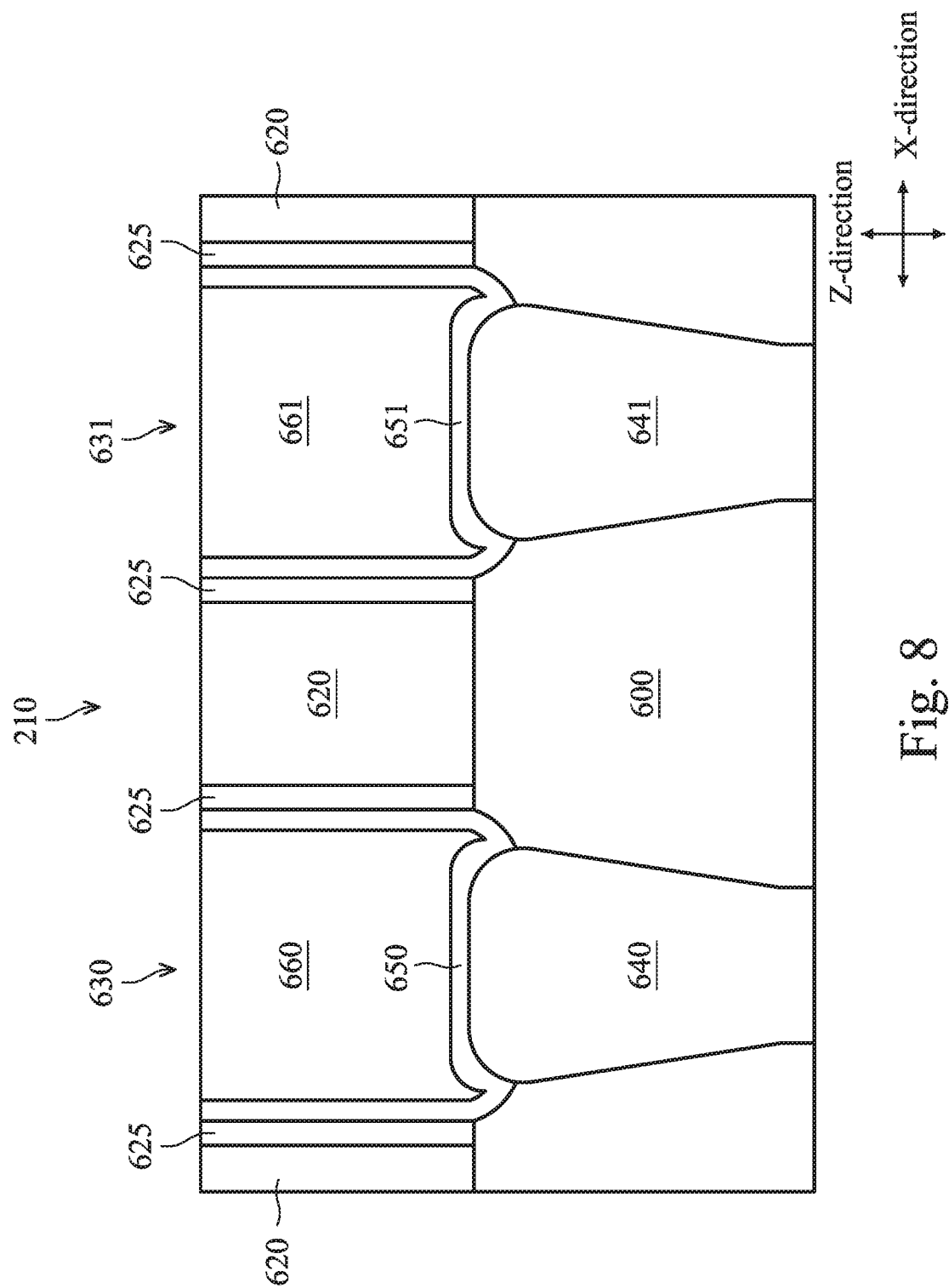

Referring now to FIG. 8, source/drain components 640-641 are formed. In some embodiments, the source/drain components 640-641 are formed at least in part using epitaxial growth. In some embodiments, portions of the semiconductive layer 600 exposed by the openings 630-631 may be etched, and the source/drain components 640-641 may be epitaxially grown in place of the removed portions of the semiconductive layer 600. Etching-stop layers 650-651 may also be formed in the openings 630-631, for example over the source/drain components 640-641 and on sidewalls of the gate spacers 625. ILD components 660-661 are then formed on the etching-stop layers 650-651 and to fill the openings 630-631.

Figure 9:
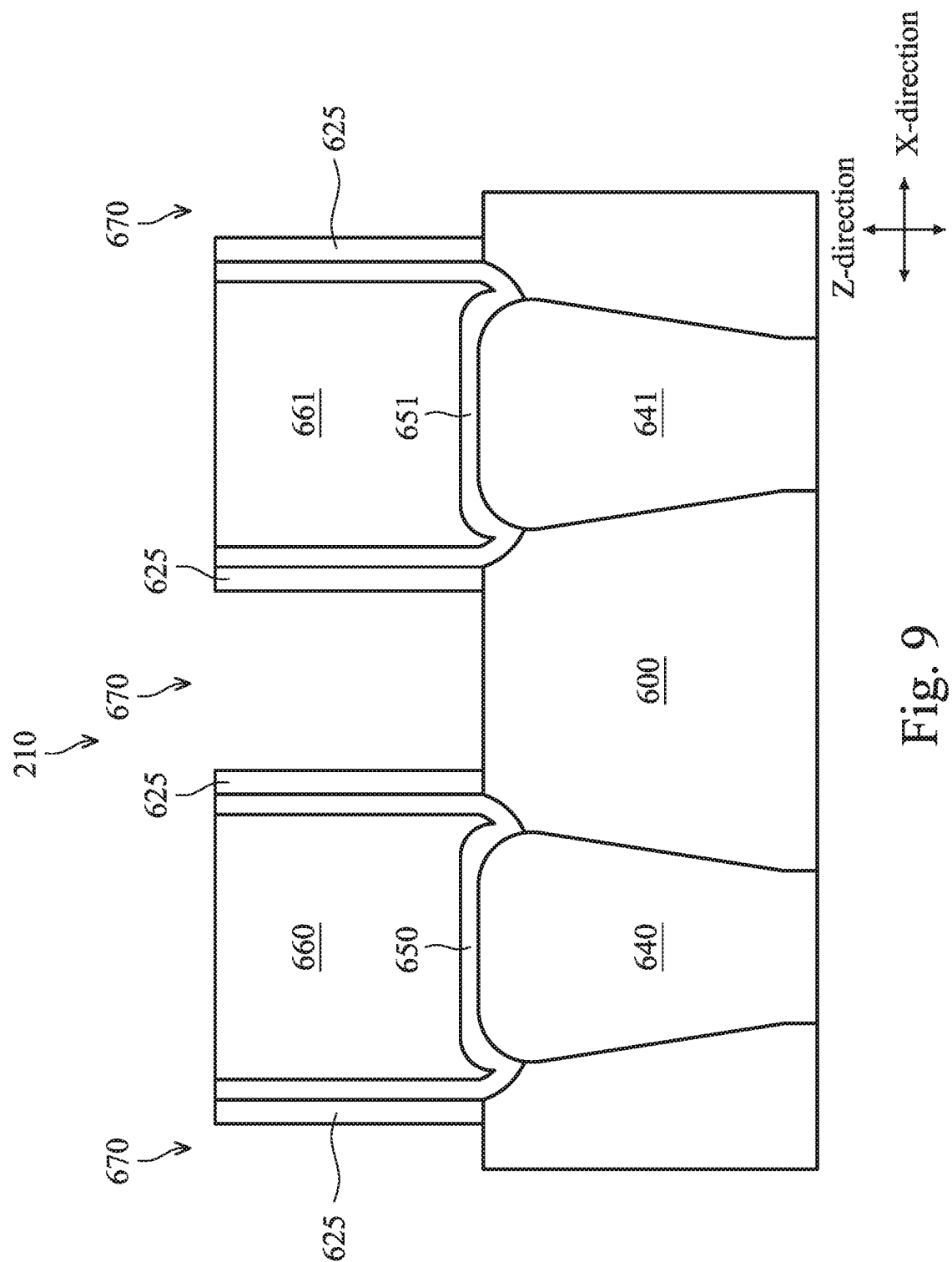

Referring now to FIG. 9, one or more etching processes may be performed to remove the dummy gate layer 620, thereby forming openings 670 in place of the removed dummy gate layer 620. Note that the gate spacers 625 still remain after the dummy gate layer 620 has been removed.

Figure 10:
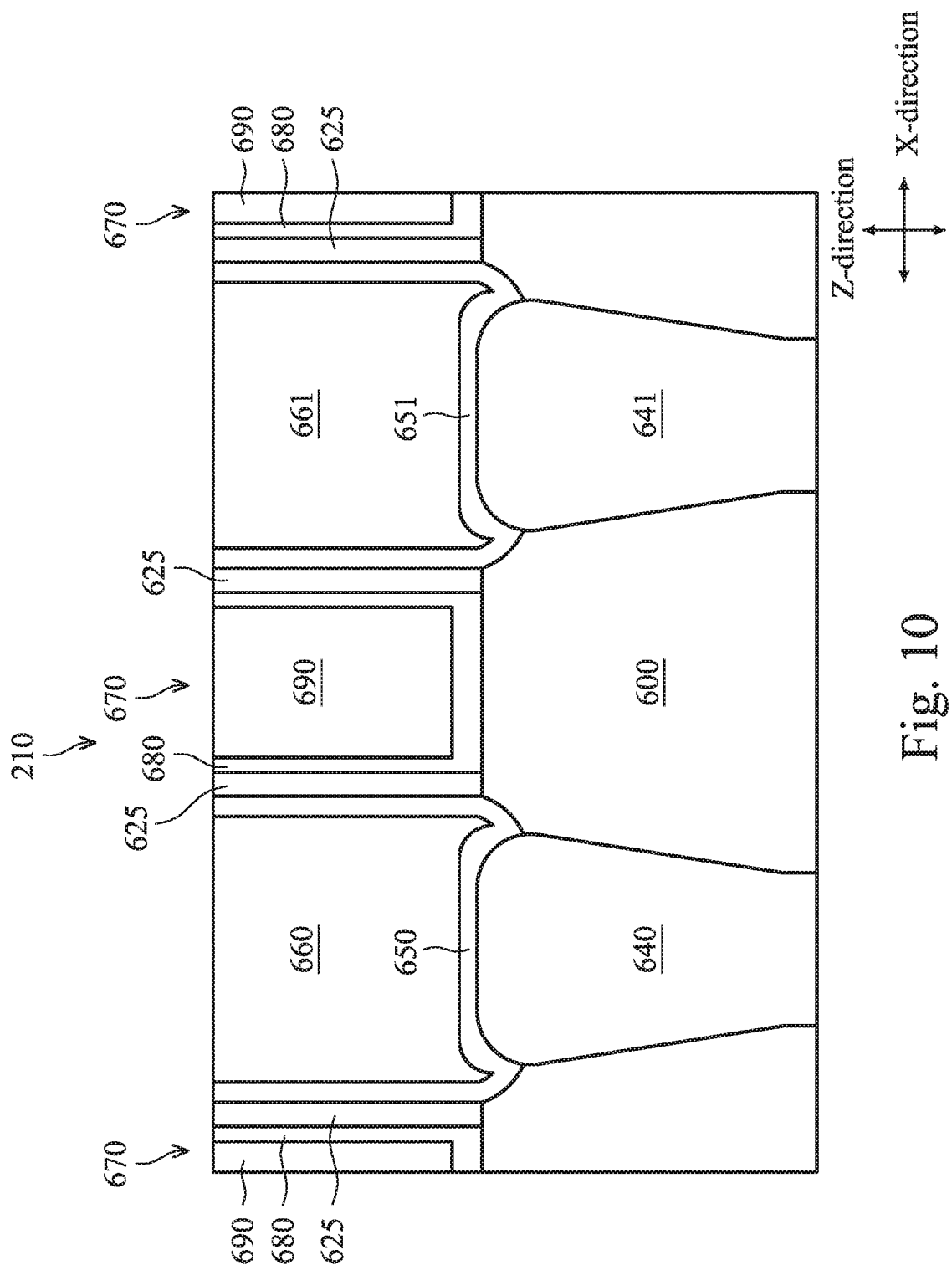

Referring now to FIG. 10, functional gate structures are formed in the openings 670 to replace the removed dummy gate layer 620. The functional gate structures include a high-k gate dielectric layer 680 and a metal gate electrode layer 690. The high-k dielectric layer 680 is formed on the sidewalls of the gate spacers 625.

Figure 11:
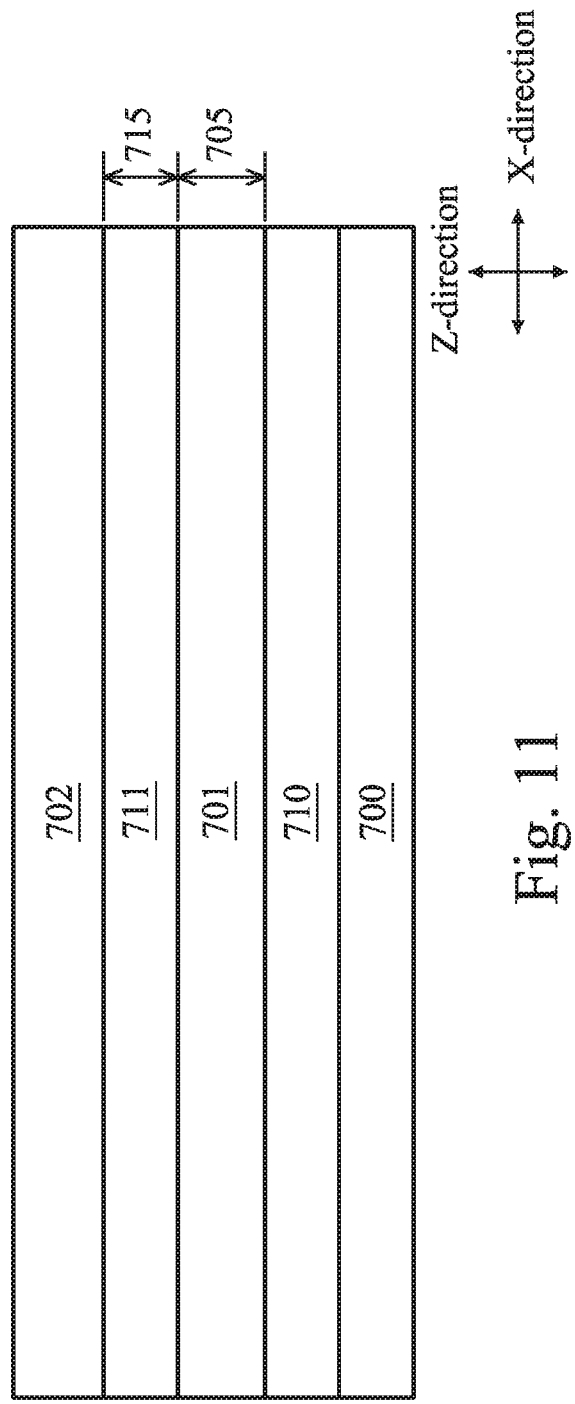

Whereas FIGS. 7-10 illustrate the fabrication process flow of forming FinFETs in the PMOS region 210, FIGS. 11-16 illustrate the fabrication process flow of forming nano-structure channels in the NMOS region 220. Referring to FIG. 11, a plurality of semiconductive layers are formed over a substrate. In the illustrated embodiment, the plurality of semiconductive layers may include semiconductive layers 700, 701, and 702. The semiconductive layer 700-702 may include Si, SiGe, a group IV material, or a group III-V material, as non-limiting examples. These semiconductive layers 700-702 may serve as the channel regions of GAA transistors formed in the NMOS region. The semiconductive layers 700-702 may each have a thickness 705 measured in the Z-direction. In some embodiments, the thickness 705 is in a range between about 2 nm and about 10 nm.

The semiconductive layers 700-702 are separated from one another by sacrificial layers 710-711. In some embodiments, the sacrificial layers 710-711 may contain a dielectric material, for example SiOx, SiN, or SiON. In some other embodiments, the sacrificial layers 710-711 may contain a semiconductor material, for example Si, Ge, SiGe, GeSn, or SiGeSn. The sacrificial layers 710-711 may each have a thickness 715 measured in the Z-direction. In some embodiments, the thickness 715 is greater than about 5 nm.

It is understood that the number of semiconductive layers and sacrificial layers may be different (i.e., not limited to three semiconductive layers and two sacrificial layers). Also, though the semiconductive layers 700-702 and the sacrificial layers 710-711 may vary in thickness, their respective thicknesses 705 and 715 may vary within a predefined ratio range. In some embodiments, a ratio between the thicknesses 705 and 715 is in a range between about 4:10 and about 2:1.

Figure 12:
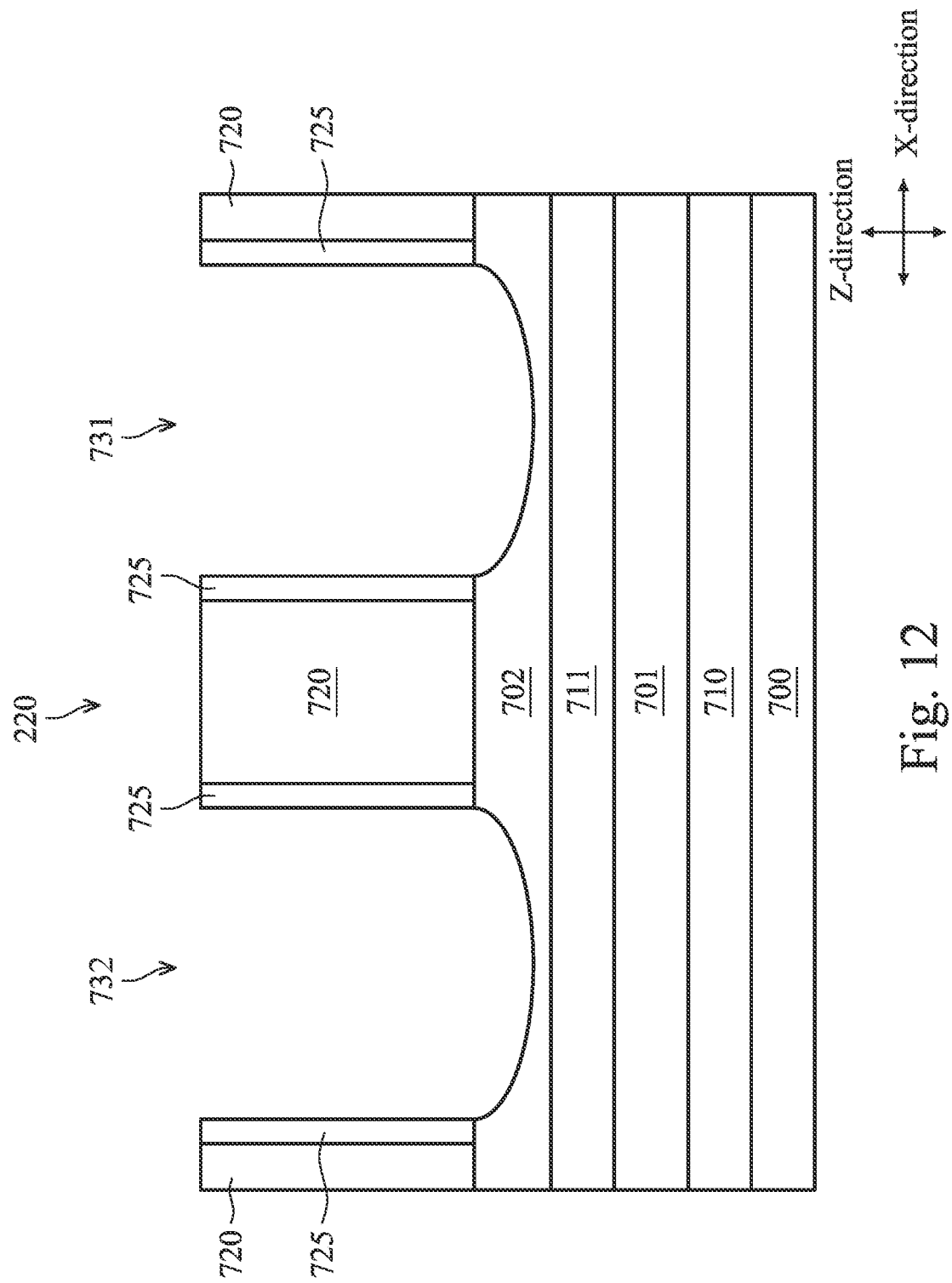

Referring now to FIG. 12, a dummy gate layer 720 is formed over the uppermost semiconductive layer 702. In some embodiments, the dummy gate layer 720 may include a polysilicon gate electrode layer and a suitable gate dielectric layer, which may be a dummy gate dielectric layer such as silicon oxide, or a high-k gate dielectric layer. One or more lithography processes may be performed to pattern the dummy gate layer 720, so as to form openings 731-732, for example. Gate spacers 725 are formed on the sidewalls of the patterned dummy gate layer 720. The gate spacers 725 may include a dielectric material, for example SiOx, SiN, SiON, SiOC, SiCN, or SiOCN. Portions of the semiconductive layer 700 are exposed by the openings 731-732.

Figure 13:
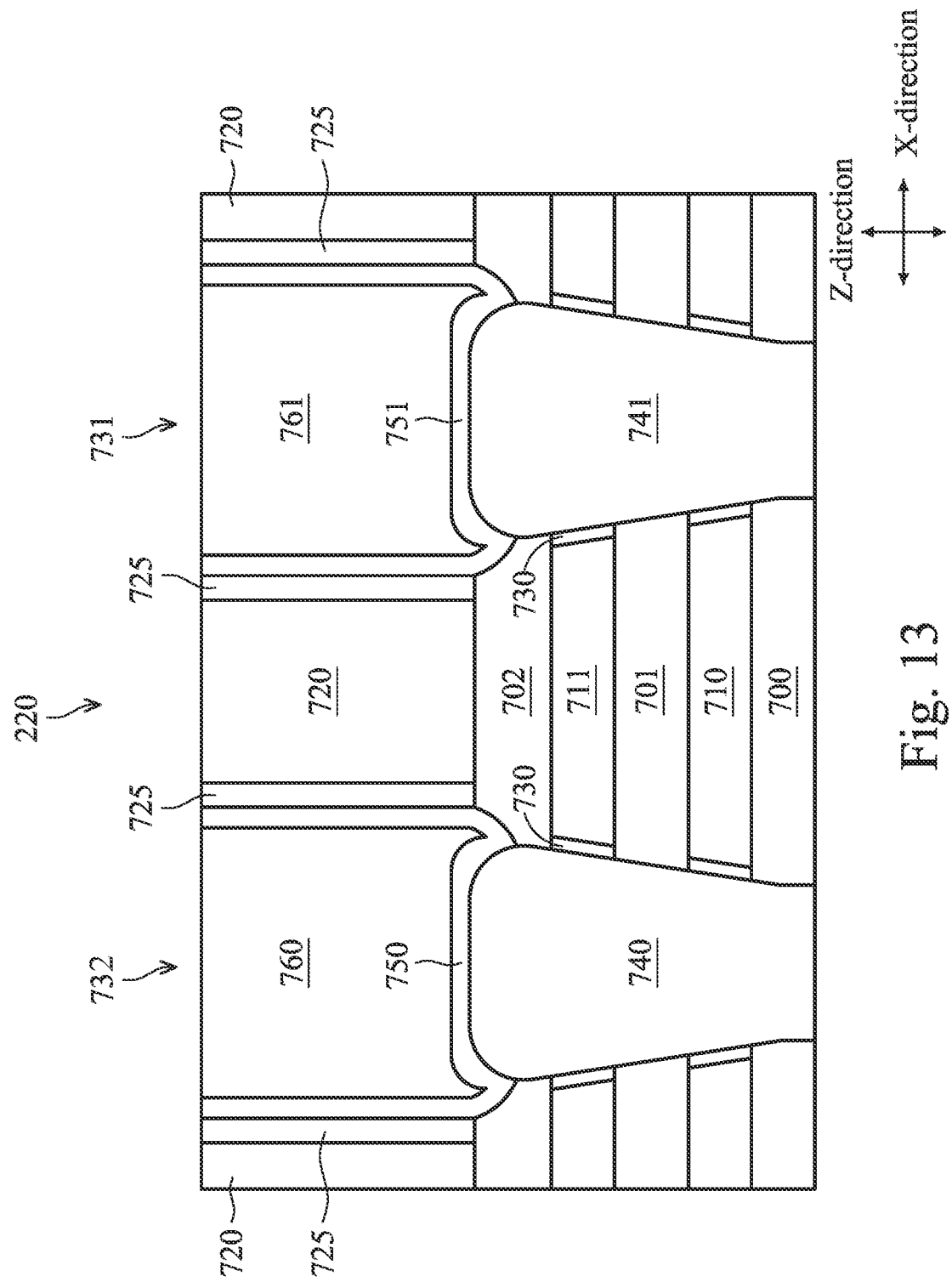

Referring now to FIG. 13, inner spacers 730 are formed. The inner spacers 730 may include a dielectric material. Source/drain components 740-741 are also formed. In some embodiments, the source/drain components 740-741 are formed at least in part using epitaxial growth. The inner spacers 730 are located between the sidewalls of the source/drain components 740-741 and the sacrificial layers 710-711. Etching-stop layers 750-751 may also be formed in the openings 731-732, for example over the source/drain components 740-741 and on sidewalls of the gate spacers 725. ILD components 760-761 are then formed on the etching-stop layers 750-751 and to fill the openings 731-731.

Figure 14:
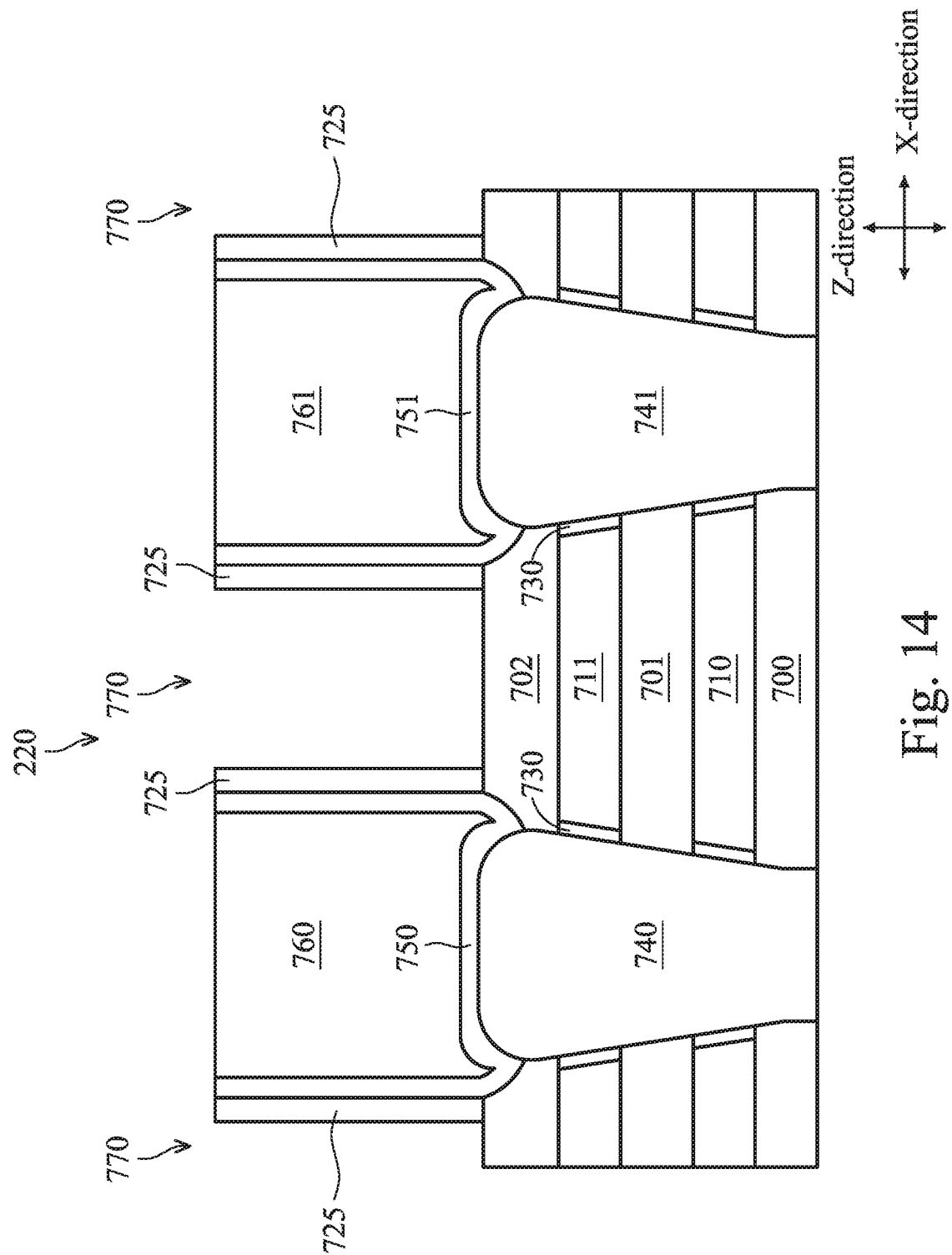

Referring now to FIG. 14, one or more etching processes may be performed to remove the dummy gate layer 720, thereby forming openings 770 in place of the removed dummy gate layer 720. Note that the gate spacers 725 still remain after the dummy gate layer 720 has been removed.

Figure 15:
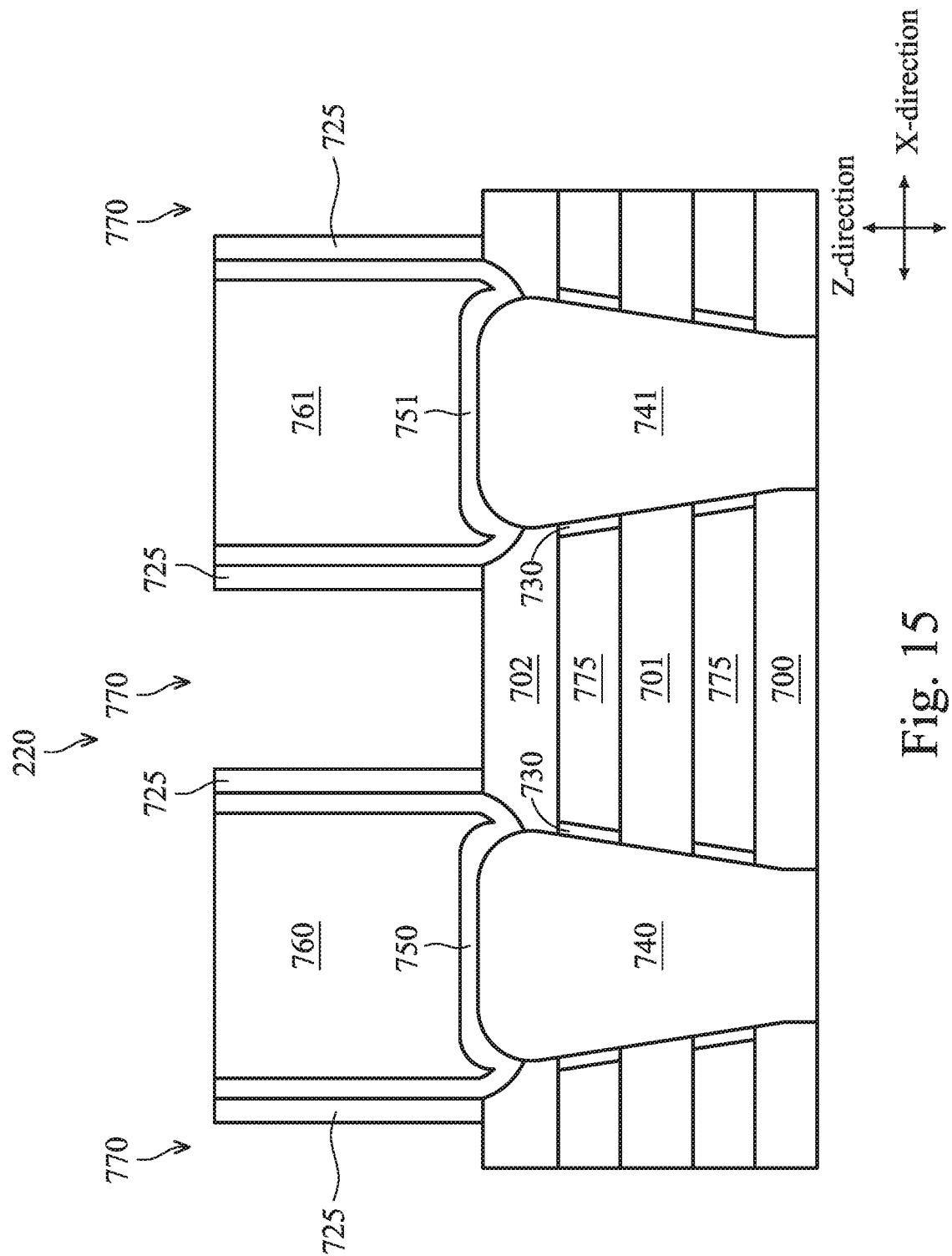

Referring now to FIG. 15, a nano-structure formation process is performed to form the nano-structure channels. For example, the sacrificial layers 710-711 are removed by one or more etching processes, where an etching selectivity is configured to exist between the semiconductive layers 700-702 and the sacrificial layers 710-711. Consequently, the removal of the sacrificial layers 710-711 has little impact on the semiconductive layers 700-702, and they remain after the removal of the sacrificial layers 710-711. The removal of the sacrificial layers 710-711 also leaves openings 775 in place of the removed sacrificial layers 710-711.

Figure 16:
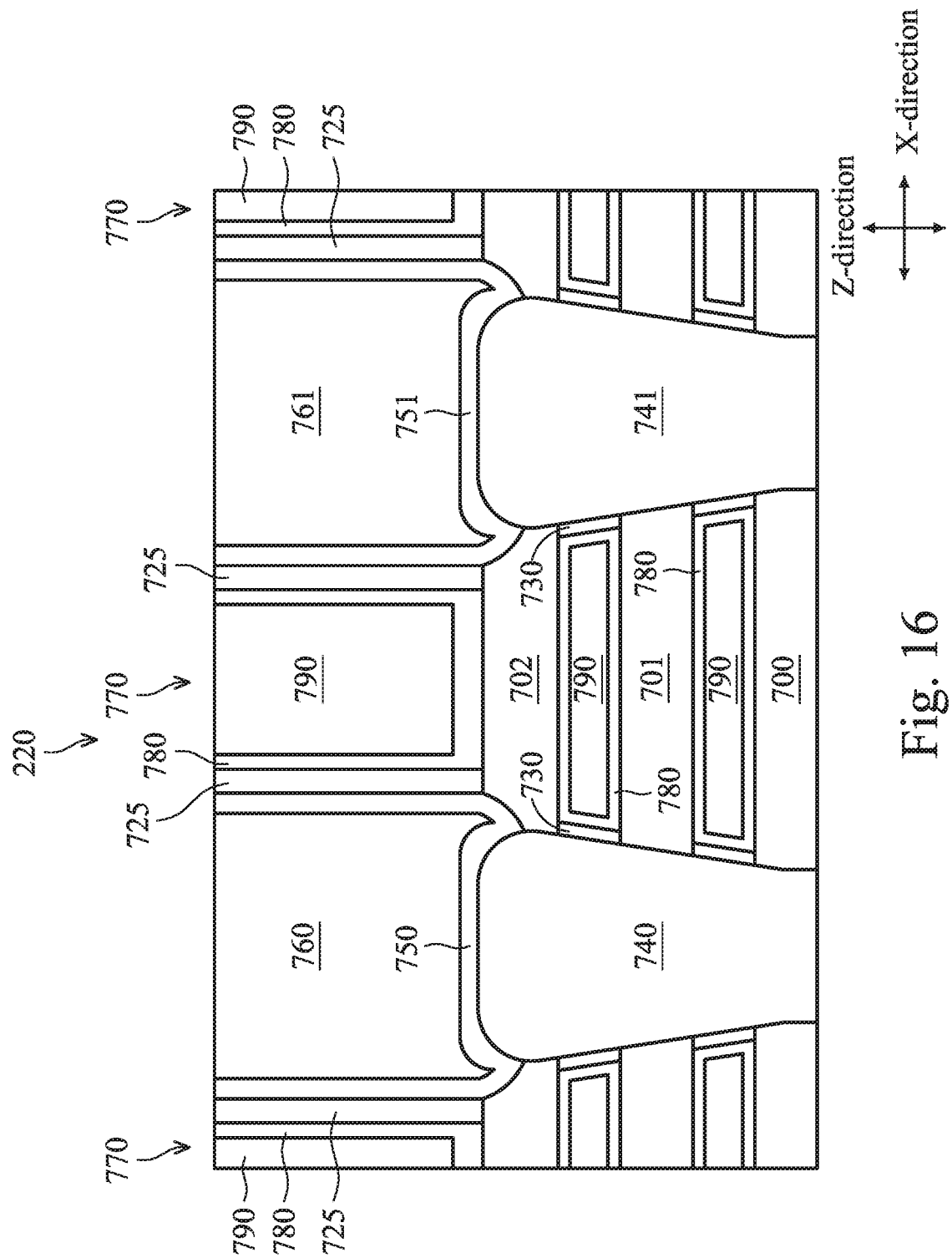
Figure 17:
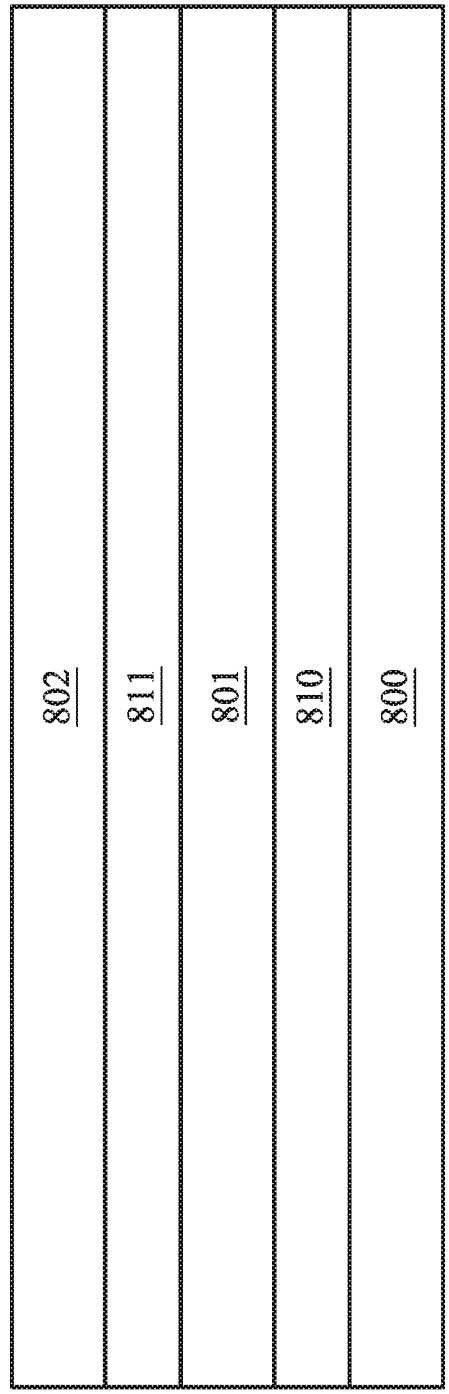

Referring now to FIG. 16, functional gate structures are formed in the openings 770 to replace the removed dummy gate layer 720. Functional gate structures are also formed in the openings 775 to replace the removed sacrificial layers 710-711. The functional gate structures each include a high-k gate dielectric layer 780 and a metal gate electrode layer 790. The high-k dielectric layer 780 is formed on the sidewalls of the gate spacers 725.

It is understood that although some of the fabrication processes for forming the FinFETs in the PMOS region 210 and the nano-structure devices in the NMOS region 220 are similar, they need not necessarily be performed at the same time. For example, the dummy gate layers 620 and 720 may be etched or removed at different times, and the functional gate structures may also be formed at different times. Similarly, the channel formation and/or source/drain formation processes need not be performed at the same time for the PMOS and NMOS devices either.

It is also understood that the fabrication process flow discussed above with reference to FIGS. 11-16 may be employed to form a nano-structure in the PMOS region 210 with a reduced number of nano-structure channels. For example, referring to FIG. 17, a vertical stack containing a plurality of interleaving semiconductor layers 800-802 and sacrificial layers 810-811 is provided. This stack is provided in the PMOS region 210, but the structural arrangement is similar to the stack of interleaving semiconductor layers 700-702 and sacrificial layers 710-711 in the NMOS region 220.

Figure 18:
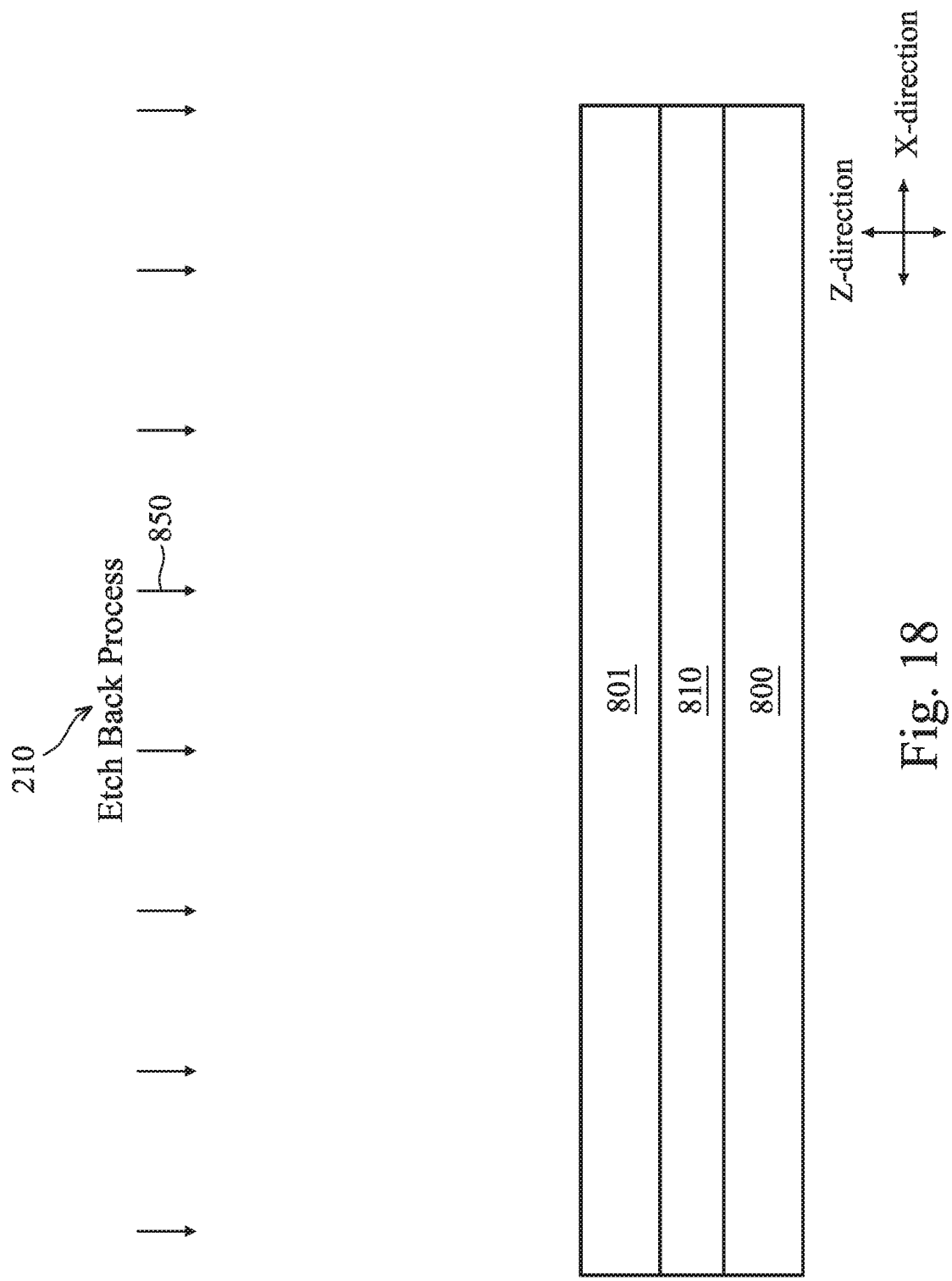

Referring now to FIG. 18, an etching back process 850 is performed to the PMOS region 210 to remove a subset of the semiconductor layers 800-802 and sacrificial layers 810-811. For example, the semiconductor layer 802 and the sacrificial layer 811 may be etched away, while the semiconductor layers 800-801 and the sacrificial layer 810 still remain. Subsequently, fabrication processes similar to those discussed above with reference to FIGS. 12-16 may be performed to the PMOS region 210. As non-limiting examples, these fabrication processes may include source/drain formation, gate replacement, nano-structure formation, etc. As a result, the PMOS region 210 may have a nano-structure channel device (e.g., a GAA device) that has fewer number of nano-structure channels than the NMOS region 220. Conversely, the etching back process 850 (or a similar process) may be performed to the NMOS region 220 (instead of the PMOS region 210) such that the NMOS region 220 may have a nano-structure channel device that has fewer number of nano-structure channels than the PMOS region 210. The different numbers of nano-structure channels between the PMOS region 210 and the NMOS region 220 provides a greater degree of design flexibility, since it allows for different amount of currents for different regions, which may be suitable for various types of IC applications.

Figure 19:
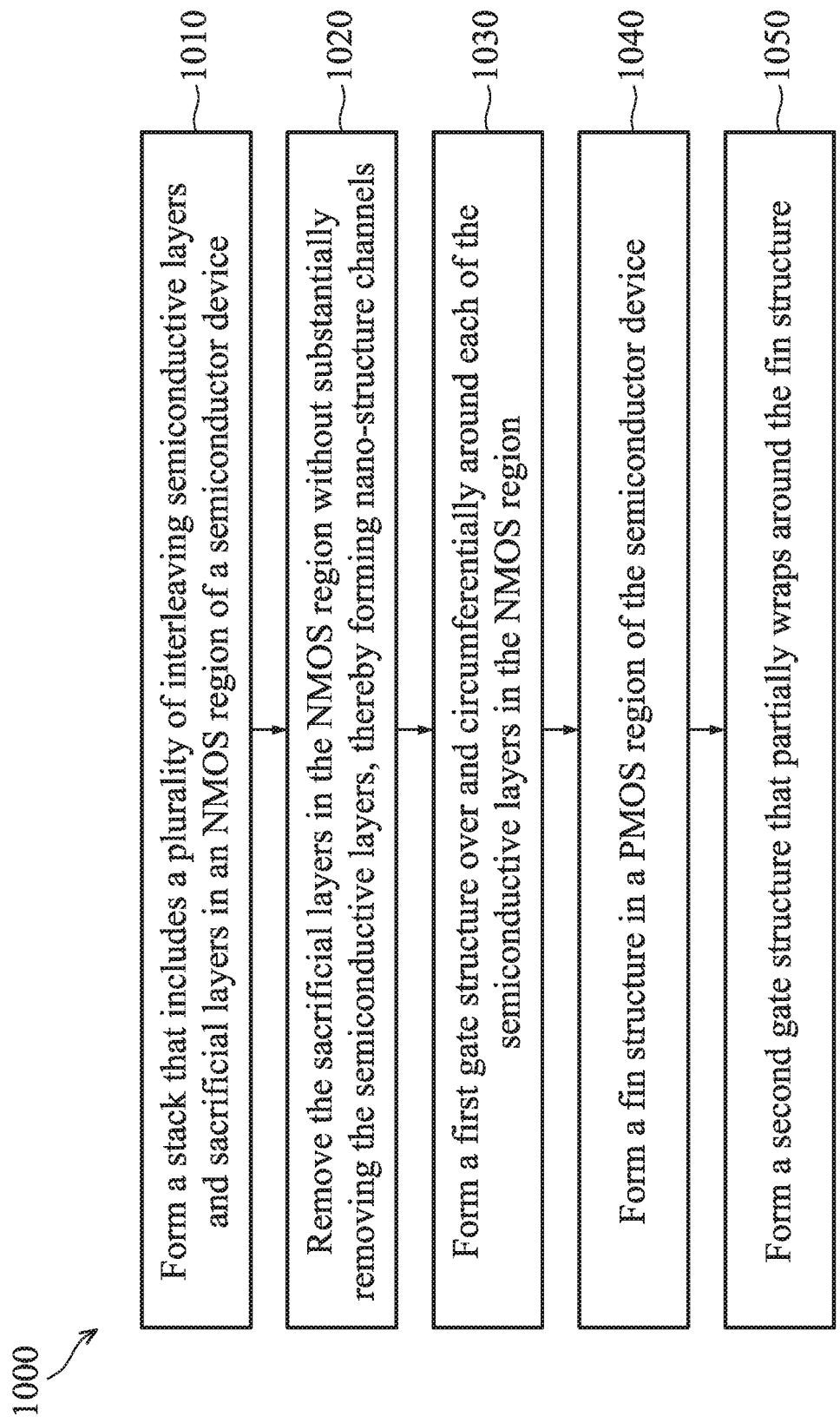
FIGS. 19-20 are flowcharts each illustrating a method of fabricating a semiconductor device according to various aspects of the present disclosure.

FIG. 19 is a flowchart illustrating a method 1000 of manufacturing a semiconductor structure, for example a GAA device. The method 1000 includes a step 1010 of forming a stack that includes a plurality of semiconductive layers and a plurality of sacrificial layers in an NMOS region of a semiconductor device. The semiconductive layers interleave with the sacrificial layers.

The method 1000 includes a step 1020 of removing the sacrificial layers in the NMOS region without substantially removing the semiconductive layers, thereby forming nano-structure channels.

The method 1000 includes a step 1030 of forming a first gate structure over and circumferentially around each of the semiconductive layers in the NMOS region. The step 1030 is performed after the step 1020.

The method 1000 includes a step 1040 of forming a fin structure in a PMOS region of the semiconductor device. The fin structure has a fin width and is separated from an adjacent fin structure by a fin pitch. A maximum channel width of the nano-structure channels is no greater than a sum of: the fin width and the fin pitch. In some embodiments, the maximum channel width is formed to be in a range between about 1-15 times of the fin width. In some embodiments, the maximum channel width is formed to be in a range within about 20%-100% of the sum of: the fin width and the fin pitch.

The method 1000 includes a step 1050 of forming a second gate structure that partially wraps around the fin structure.

In some embodiments, the semiconductor device includes a Static Random Access Memory (SRAM) device that includes a pull-up (PU) transistor, a pull-down (PD) transistor, and a pass-gate (PG) transistor. In some embodiments, the steps 1010-1030 are performed to fabricate the PD transistor or the PG transistor, and the steps 1040-1050 are performed to fabricate the PU transistor.

It is understood that the steps 1010-1030 may be performed before the steps 1040-1050 in some embodiments or may be performed after the steps 1040-1050 in other embodiments. It is also understood that the method 1000 may include further steps performed before, during, or after the steps 1010-1050. For example, the method 1000 may include a step of shaping the semiconductive layers such that the semiconductive layers have unequal widths among one another. Other steps may include formation of vias, contacts, or metal layers, etc.

Figure 20:
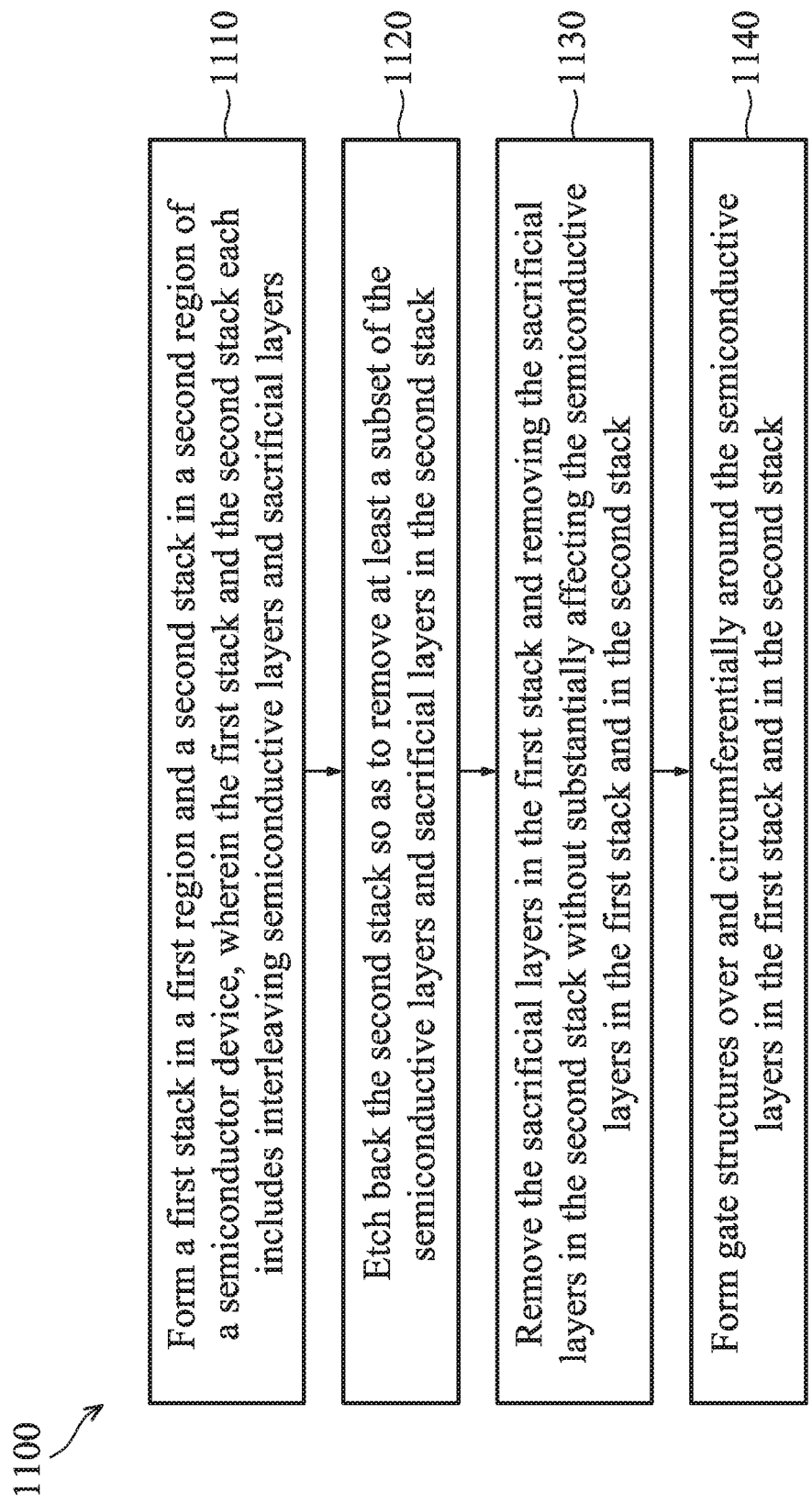

FIG. 20 is a flowchart illustrating a method 1100 of fabricating a semiconductor device. The method 1100 includes a step 1110 of forming a first stack in a first region and a second stack in a second region of a semiconductor device. The first stack and the second stack each includes a plurality of semiconductive layers and a plurality of sacrificial layers that interleave with the semiconductive layers.

The method 1100 includes a step 1120 of etching back the second stack so as to remove at least a subset of the semiconductive layers and sacrificial layers in the second stack.

The method 1100 includes a step 1130 of removing the sacrificial layers in the first stack and removing the sacrificial layers in the second stack without substantially affecting the semiconductive layers in the first stack and in the second stack.

The method 1100 includes a step 1140 of forming gate structures over and circumferentially around the semiconductive layers in the first stack and in the second stack.

In some embodiments, the steps 1110-1140 are fabrication processes for fabricating a Static Random Access Memory (SRAM) device that includes a pull-up (PU) transistor in the second region, a pull-down (PD) transistor in the first region, and a pass-gate (PG) transistor in the first region. The first stack is formed in the first region but not in the second region, and the second stack is formed in the second region but not in the first region.

It is understood that the method 1100 may include further steps performed before, during, or after the steps 1110-1140. For example, the method 1100 may include a step of shaping the semiconductive layers in at least the first stack such that the semiconductive layers in the first stack are formed to have different lateral dimensions among one another. Other steps may include formation of vias, contacts, or metal layers, etc.

In summary, the present disclosure forms a semiconductor device with a hybrid structure. In some embodiments, multi-channel nanostructure devices (e.g., a GAA device) are formed in an NMOS region, while FinFETs are formed in the PMOS region. In other embodiments, both the NMOS region and the PMOS region may be implemented using multi-channel nanostructure devices such as GAA devices, but the number of channels may be different between the NMOS region and the PMOS region. In some embodiments, the semiconductor device includes an SRAM device, where the PG and PD transistors are implemented in the NMOS region but not in the PMOS region, while the PU transistors are implemented in the PMOS region but not in the NMOS region.

Based on the above discussions, it can be seen that the embodiments of the present disclosure offer advantages over conventional devices. It is understood, however, that no particular advantage is required, other embodiments may offer different advantages, and that not all advantages are necessarily disclosed herein.

One advantage is improved device performance. For example, it may be desirable for SRAM devices to have a greater number of channels in the NMOS region (e.g., PG and/or PD transistors), so that it can handle a greater amount of current than the PMOS region (e.g., PU transistors), which may help enhance the performance (e.g., speed) of the SRAM device. The hybrid structure of the present disclosure achieves this object since the GAA devices in the NMOS region can be implemented to have a greater number of channels than the FinFETs in the PMOS region. Another advantage is that the hybrid structure of the present disclosure does not lead to a waste in chip area. For example, since the maximum channel width of the nano-structure channels in the GAA device is smaller than a sum of the fin width and fin pitch, the NMOS region can be implemented with multiple channels (because the channels are stacked vertically) without increasing the horizontal space occupied by the transistors in the NMOS region. As such, the hybrid structure herein can simultaneously improve device performance and reduce chip area. Other advantages may include ease of fabrication and compatibility with existing fabrication processes.

One embodiment of the present disclosure involves a semiconductor device. The semiconductor device includes a first device disposed in an NMOS region of the semiconductor device. The first device includes a first gate-all-around (GAA) device having a vertical stack of nano-structure channels. The semiconductor device also includes a second device in a PMOS region of the semiconductor device. The second device includes a FinFET that includes a fin structure having a fin width. The fin structure is separated from an adjacent fin structure by a fin pitch. A maximum channel width of the nano-structure channels is no greater than a sum of: the fin width and the fin pitch. Alternatively, the second device includes a second GAA device having a different number of nano-structure channels than the first GAA device.

Another embodiment of the present disclosure involves a method. A stack is formed that includes a plurality of semiconductive layers and a plurality of sacrificial layers in an NMOS region of a semiconductor device. The semiconductive layers interleave with the sacrificial layers. The sacrificial layers are removed in the NMOS region without substantially removing the semiconductive layers, thereby forming nano-structure channels. After the removing of the sacrificial layers, a first gate structure is formed over and circumferentially around each of the semiconductive layers in the NMOS region. A fin structure is formed in a PMOS region of the semiconductor device. A second gate structure is formed that partially wraps around the fin structure. The fin structure has a fin width and is separated from an adjacent fin structure by a fin pitch. A maximum channel width of the nano-structure channels is no greater than a sum of: the fin width and the fin pitch.

Yet another embodiment of the present disclosure involves a method. A first stack is formed in a first region and a second stack is formed in a second region of a semiconductor device. The first stack and the second stack each includes a plurality of semiconductive layers and a plurality of sacrificial layers that interleave with the semiconductive layers. The second stack is etched back so as to remove at least a subset of the semiconductive layers and sacrificial layers in the second stack. The sacrificial layers are removed in the first stack, and the sacrificial layers are removed in the second stack, without substantially affecting the semiconductive layers in the first stack and in the second stack. Gate structures are formed over and circumferentially around the semiconductive layers in the first stack and in the second stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first device disposed in an NMOS region of the semiconductor device, wherein the first device includes a first gate-all-around (GAA) device having a vertical stack of at least three nano-structure channels; and
a second device in a PMOS region of the semiconductor device, wherein the second device includes: a FinFET that includes a fin structure having a fin width, wherein the fin structure is separated from an adjacent fin structure by a fin pitch, wherein a maximum channel width of the nano-structure channels is no greater than a sum of: the fin width and the fin pitch and wherein an upper surface of the fin structure is more vertically elevated than at least a middle one of the nano-structure channels but less vertically elevated than at least a top one of the nano-structure channels;
wherein:
wherein the semiconductor device includes a Static Random Access Memory (SRAM) device;
the SRAM device includes a pull-up (PU) transistor, a pull-down (PD) transistor, and a pass-gate (PG) transistor;
the first GAA device is a part of the PD transistor or a part of the PG transistor but not a part of the PU transistor; and
the FinFET is a part of the PU transistor but not a part of the PD transistor or a part of the PG transistor.

2. The semiconductor device of claim 1, wherein:
the maximum channel width is greater than the fin width but less than 15 times of the fin width.

3. The semiconductor device of claim 1, wherein:
the maximum channel width is within about 20%-100% of the sum of: the fin width and the fin pitch.

4. The semiconductor device of claim 1, wherein the first GAA device includes a gate that circumferentially surrounds each of the nano-structure channels in a cross-sectional side view.

5. The semiconductor device of claim 1, wherein: the nano-structure channels have uneven channel widths.

6. The semiconductor device of claim 5, wherein:
the top one of the nano-structure channels has the maximum channel width;
a bottommost one of the nano-structure channels has a minimum channel width; and
the middle one of the nano-structure channels that is located between the top one of the nano-structure channels and the bottommost one of the nano-structure channels has an intermediate channel width that is less than the maximum channel width but greater than the minimum channel width.

7. The semiconductor device of claim 5, wherein:
top one of the nano-structure channels has a minimum channel width;
a bottommost one of the nano-structure channels has the maximum channel width; and
the middle one of the nano-structure channels that is located between the top one of the nano-structure channels and the bottommost one of the nano-structure channels has an intermediate channel width that is less than the maximum channel width but greater than the minimum channel width.

8. The semiconductor device of claim 1, wherein each of the nano-structure channels is shaped as a sheet, a bar, or a wire.

9. The semiconductor device of claim 1, wherein:
a width of the top one of the nano-structure channels varies within 40%-100% of a width of a bottommost one of the nano-structure channels; or
the width of the bottommost one of the nano-structure channels varies within 40%-100% of the width of the top one of the nano-structure channels.

10. A semiconductor device, comprising:
a gate-all-around (GAA) transistor located in a first region of the semiconductor device, wherein the GAA transistor includes a vertical stack of nano-structure channels, the vertical stack of nano-structure channels including a bottommost nano-structure channel, an uppermost nano-structure channel, and an intermediate nano-structure channel disposed between the bottommost nano-structure channel and the uppermost nano-structure channel; and
a FinFET transistor that contains a fin structure located in a second region of the semiconductor device, wherein one of the first region and the second region corresponds to a N-type region, wherein another one of the first region and the second region corresponds to a P-type region, wherein the FinFET transistor has a fin width and a fin pitch, and wherein a maximum width of the vertical stack of nano-structure channels is smaller than a sum of the fin width and the fin pitch;
wherein:
an upper surface of the fin structure is taller than an upper surface of the intermediate nano-structure channel but shorter than an upper surface of the uppermost nano-structure channel;
the semiconductor device includes a Static Random Access Memory (SRAM) having a pull-up (PU) transistor, a pull-down (PD) transistor, and a pass-gate (PG) transistor;
the GAA transistor is a part of the PD transistor or a part of the PG transistor but not a part of the PU transistor; and
the FinFET transistor is a part of the PU transistor but not a part of the PD transistor or a part of the PG transistor.

11. The semiconductor device of claim 10, wherein:
the FinFET transistor includes a fin structure that extends in a first horizontal direction;
the fin width measured in a second horizontal direction different from the first horizontal direction;
the fin structure is separated from an adjacent fin structure by the fin pitch; and
the maximum width of the vertical stack of nano-structure channels is a width of the bottommost nano-structure channel that is measured in the second horizontal direction.

12. The semiconductor device of claim 11, wherein:
the maximum width of the vertical stack of nano-structure channels is greater than the fin width but is less than 15 times of the fin width and within about 20%-100% of the sum of: the fin width and the fin pitch.

13. The semiconductor device of claim 10, wherein:
each of the nano-structure channels is shaped as a sheet, a bar, or a wire;
the nano-structure channels have uneven channel widths; and the GAA transistor includes a gate that circumferentially surrounds each of the nano-structure channels in a cross-sectional side view.

14. The semiconductor device of claim 13, wherein:
the uppermost nano-structure channel has a first channel width, the bottommost nano-structure channel has a second channel width, and the intermediate nano-structure channel has a third channel width; and
the third channel width is greater than one of the first channel width and the second channel width but is less than another one of the first channel width and the second channel width.

15. The semiconductor device of claim 10, wherein:
a width of the uppermost nano-structure channel varies within 40%-100% of a width of the bottommost nano-structure channel; or the width of the bottommost nano-structure channel varies within 40%-100% of the width of the uppermost nano-structure channel.

16. A semiconductor device, comprising:
a gate-all-around (GAA) transistor formed in an NMOS region of the semiconductor device, wherein the GAA transistor includes a vertical stack of nano-structure channels, wherein each of the nano-structure channels is shaped as a sheet, a bar, or a wire, wherein the nano-structure channels have uneven channel widths, and wherein the vertical stack of nano-structure channels includes a first nano-structure channel, a second nano-structure channel disposed over the first nano-structure channel, and a third nano-structure channel disposed over the second nano-structure channel; and
a FinFET transistor located in a PMOS region of the semiconductor device;
wherein:
the GAA transistor is a part of a pull-down transistor of a Static Random Access Memory (SRAM) or a part of a pass-gate of the SRAM but is not a part of a pull-up transistor of the SRAM;
the FinFET transistor is a part of the pull-up transistor of the SRAM but is not a part of the pull-down transistor or the pass-gate of the SRAM;
the FinFET transistor includes a fin structure having a fin width;
the fin structure is separated from an adjacent fin structure by a fin pitch;
a maximum channel width of the nano-structure channels is smaller than or equal to: a sum of the fin width and the fin pitch; and
an upper surface of the fin structure is more vertically elevated than an upper surface of the second nano-structure channel but less vertically elevated than an upper surface of the third nano-structure channel.

17. The semiconductor device of claim 16, wherein: an uppermost nano-structure channel of the vertical stack of nano-structure channels has an upper surface that is more elevated vertically than the fin structure.

18. The semiconductor device of claim 16, wherein the maximum channel width of the nano-structure channels corresponds to a width of a bottommost nano- structure channel of the vertical stack of nano-structure channels.

19. The semiconductor device of claim 16, wherein the maximum channel width is greater than the fin width.

20. The semiconductor device of claim 16, wherein the first nano-structure channel is wider than the second nano-structure channel, and wherein the second nano-structure channel is wider than the third nano-structure channel.

* * * * *